United States Patent
Godfrey et al.

(10) Patent No.: US 10,955,873 B1
(45) Date of Patent: Mar. 23, 2021

(54) DISPLAY DEVICE

(71) Applicant: Lenovo (Singapore) Pte. Ltd., Singapore (SG)

(72) Inventors: Cyan Godfrey, Chapel Hill, NC (US); Cuong Huy Truong, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 16/676,038

(22) Filed: Nov. 6, 2019

(51) Int. Cl.
- *G06F 1/16* (2006.01)
- *H05K 5/02* (2006.01)
- *H05K 5/00* (2006.01)

(52) U.S. Cl.
CPC ......... *G06F 1/1607* (2013.01); *H05K 5/0017* (2013.01); *H05K 5/0234* (2013.01); *H05K 5/0247* (2013.01); *G06F 2200/1612* (2013.01)

(58) Field of Classification Search
CPC .. G06F 1/1607; H05K 5/0017; H05K 5/0234; H05K 5/0247
See application file for complete search history.

(56) References Cited

U.S. PATENT DOCUMENTS

| | | | | |
|---|---|---|---|---|
| 6,229,584 B1* | 5/2001 | Chuo | ............ | G06F 1/1601 248/917 |
| 7,126,815 B2* | 10/2006 | Hwang | ............ | F16M 11/105 361/679.06 |
| 7,145,767 B2* | 12/2006 | Mache | ............ | F16M 11/046 361/679.21 |
| 7,789,354 B2* | 9/2010 | Gan | ............ | F16M 11/14 248/121 |
| 8,794,579 B2* | 8/2014 | Sturman | ............ | F16M 11/105 248/284.1 |
| 9,256,249 B2* | 2/2016 | Truong | ............ | G06F 1/1601 |
| 2001/0023914 A1* | 9/2001 | Oddsen, Jr. | ............ | F16M 11/24 248/274.1 |
| 2003/0063432 A1* | 4/2003 | Farrow | ............ | G06F 1/181 361/679.02 |
| 2004/0047115 A1* | 3/2004 | Helot | ............ | F16M 11/2021 361/679.06 |
| 2005/0201046 A1* | 9/2005 | Hwang | ............ | G06F 1/1601 361/679.06 |
| 2006/0133016 A1* | 6/2006 | North | ............ | F16M 11/10 361/679.22 |
| 2006/0240704 A1* | 10/2006 | Corbett | ............ | H04N 5/64 439/502 |

(Continued)

*Primary Examiner* — Abhishek M Rathod
*Assistant Examiner* — Keith DePew
(74) *Attorney, Agent, or Firm* — Brian J. Pangrle

(57) ABSTRACT

An assembly can include a stand that includes a base, an arm that extends from the base to a free end, and a shell operatively coupled to the arm, where the arm includes a front, a back and a side channel disposed between the front and the back, where the side channel includes a curved portion and a straight portion, and where the shell includes a front opening, a bottom end opening, an open orientation that exposes a portion of the back and the side channel of the arm and a closed orientation that covers the side channel of the arm where the side channel is accessible via the front opening of the shell and is accessible via the bottom end opening of the shell; and a display device that includes cable connectors and an arm mount to couple the display device to the free end of the arm.

20 Claims, 16 Drawing Sheets

(56) References Cited

U.S. PATENT DOCUMENTS

| | | | |
|---|---|---|---|
| 2009/0079665 A1* | 3/2009 | Moscovitch | F16M 11/10 |
| | | | 345/1.3 |
| 2009/0166482 A1* | 7/2009 | Gan | H05K 5/0204 |
| | | | 248/122.1 |
| 2013/0161466 A1* | 6/2013 | Lau | F16M 13/022 |
| | | | 248/288.11 |
| 2013/0284513 A1* | 10/2013 | Oh | G06F 1/1607 |
| | | | 174/520 |
| 2013/0321992 A1* | 12/2013 | Liu | E05D 11/0054 |
| | | | 361/679.01 |
| 2014/0063771 A1* | 3/2014 | Bando | F16M 11/10 |
| | | | 361/809 |
| 2014/0328010 A1* | 11/2014 | Lin | G06F 1/1656 |
| | | | 361/679.01 |
| 2014/0340828 A1* | 11/2014 | Truong | H05K 7/16 |
| | | | 361/679.22 |
| 2015/0163935 A1* | 6/2015 | Kasuga | H04N 5/64 |
| | | | 361/807 |
| 2017/0016569 A1* | 1/2017 | Balch | F16M 11/10 |
| 2017/0051865 A1* | 2/2017 | Chen | F16M 11/046 |
| 2019/0025877 A1* | 1/2019 | Grisack | G06F 1/181 |
| 2019/0141848 A1* | 5/2019 | Sung | G06F 1/181 |
| 2019/0278330 A1* | 9/2019 | Borloz | F16M 11/08 |

\* cited by examiner

US 10,955,873 B1

DISPLAY DEVICE

CROSS-REFERENCE TO RELATED APPLICATIONS

This application is related to commonly assigned U.S. patent application Ser. No. 16/675,975, entitled SLOTTED BASE DISPLAY DEVICE, which has been filed on the same date as this application and which is incorporated by reference herein in its entirety.

TECHNICAL FIELD

Subject matter disclosed herein generally relates to computing and display devices.

BACKGROUND

A device can include a display and a base where the display is operatively coupled to the base via an arm.

SUMMARY

An assembly can include a stand that includes a base, an arm that extends from the base to a free end, and a shell operatively coupled to the arm, where the arm includes a front, a back and a side channel disposed between the front and the back, where the side channel includes a curved portion and a straight portion, and where the shell includes a top, a bottom, a front opening, a bottom end opening, an open orientation that exposes a portion of the back and the side channel of the arm and a closed orientation that covers the side channel of the arm where the side channel is accessible via the front opening of the shell and is accessible via the bottom end opening of the shell; and a display device that includes cable connectors and an arm mount to couple the display device to the free end of the arm. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
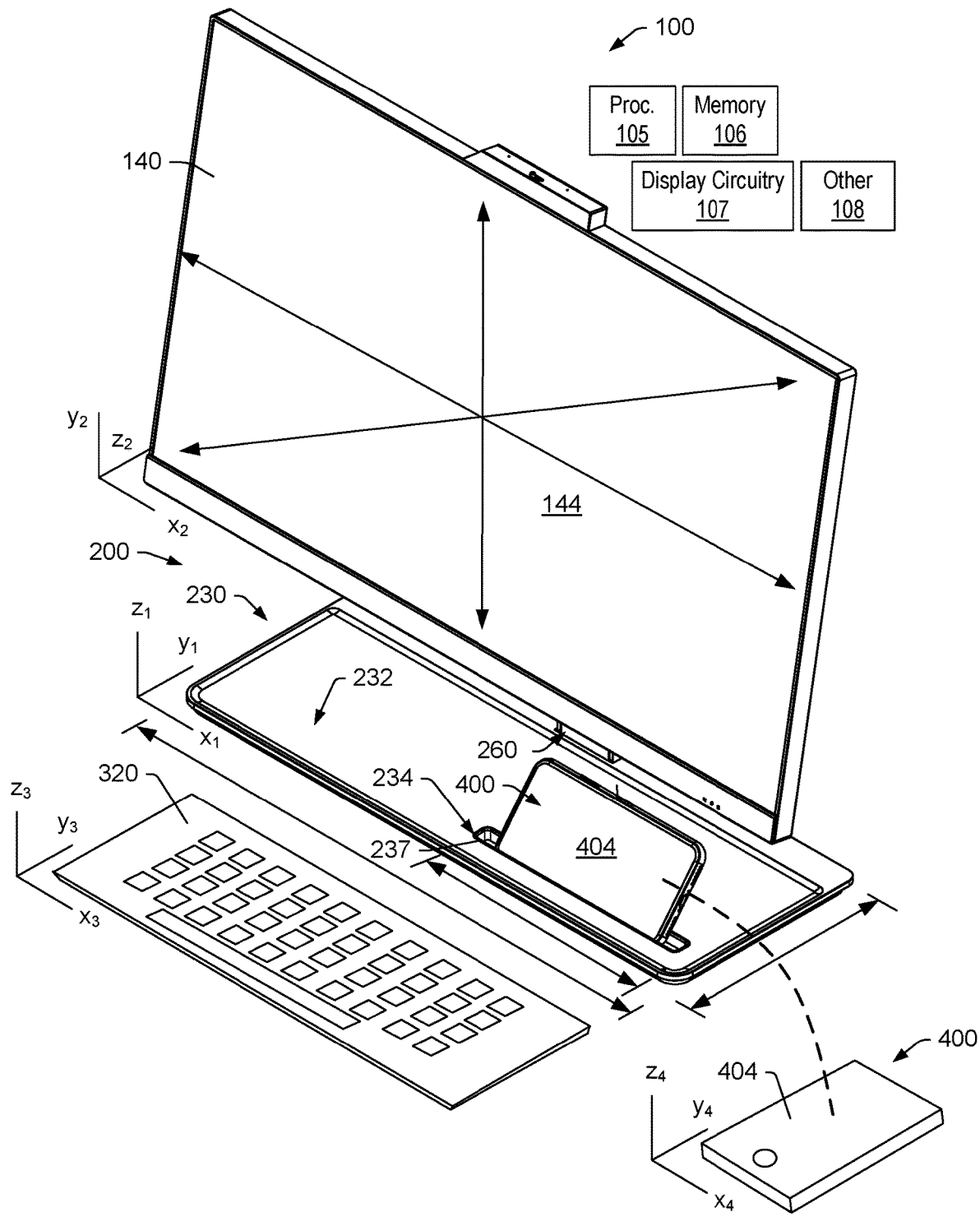
FIG. 1 is a perspective view of an example of a display device.

FIG. 1 shows an example of a computing device 100 that can include one or more processors 105, memory 106 accessible to at least one of the one or more processors 105, display circuitry 107 and one or more other components 108, which can include electronic circuitry, instructions stored in the memory 106 and executable by at least one of the one or more processors 105, etc.

As shown in FIG. 1, the computing device 100 includes a display housing 140 with a display surface 144 that may utilize one or more technologies (e.g., LED, LCD, etc.). The display circuitry 107 can be operatively coupled to at least one of the one or more processors 105, for example, to receive data, instructions, etc., for rendering text, graphics, images, etc., to the display surface 144. As an example, the display circuitry 107 can include one or more graphics processing units (GPUs) and, for example, one or more of the one or more processors 105 can be a central processing unit (CPU). As an example, the display circuitry 107 can include input circuitry such as touch circuitry, digitizer circuitry, etc., such that the display surface 144 is an input surface. For example, the display surface 144 may receive input via touch, a stylus, etc. As an example, the display housing 140 can be a housing for a touchscreen display where a finger, a stylus, etc., can be utilized; noting sensing as to input may occur with or without physical contact between a finger and the display surface 144, between a stylus and the display surface 144, etc., depending on the type of input circuitry utilized (e.g., resistive, capacitive, acoustic wave, infrared, optical, dispersive signal, etc.).

In the example of FIG. 1, the computing device 100 is supported by a stand 200 that includes a base 230 operatively coupled to an arm 260 where the computing device 100 is operatively coupled to the arm 260. As an example, the computing device 100 may be oriented via the stand 200.

In the example of FIG. 1, the base 230 includes a substantially planar upper surface 232, which includes a slot 234 defined in part by an opening 237 in the upper surface 232. As shown, the computing device 100 may be utilized with a keyboard 320, which may be dimensioned for placement on the upper surface 232 of the base 230, for example, to provide an organized workspace (e.g., consider storage of the keyboard 320 on the upper surface 232 when the keyboard is not being used, etc.). As an example, the slot 234 may support a mobile device 400 with a display surface 404, which may be utilized, for example, when the keyboard 320 or other component is not covering the opening 237 of the slot 234 of the base 230. As an example, one or more types of human input devices (HIDs) may be utilized such as, for example, a mouse, a trackpad, a rollerball, etc., to provide input to the computing device 100. As an example, a HID may be a type of peripheral (e.g., a peripheral device).

In the example of FIG. 1, the arm 260 can extend from the base 230 and include an arm mount that couples the arm 260 to the display housing 140, for example, on a back side of the display housing 140 that is opposite the display surface 144 of the display housing 140. As explained, the display surface 144 can be part of a display that includes the display circuitry 107, which may include one or more types of touch, digitizer, etc., circuitry. As shown, the computing device 100, the stand 200, the display housing 140 and/or the display surface 144 can be defined with respect to one or more coordinate systems such as, for example, one or more Cartesian coordinate systems (see, e.g., $z_1$ and $x_2, y_2, z_2$). The keyboard 320 and the mobile device (e.g., or a peripheral) 400 can be defined with respect to one or more coordinate systems such as, for example, one or more Cartesian coordinate systems (see, e.g., $x_3, y_3, z_3$ and $x_4, y_4, z_4$).

In the example of FIG. 1, the slot 234 may be a through-slot defined by the upper opening 237 and a lower opening in the base 230, where the slot 234 receives a portion of the mobile device 400, which may be a smartphone or another type of computing device that can be oriented in a planar orientation to be received at least in part in the slot 234. As shown, the slot 234 can be a linear slot that may be defined by a longitudinal slot axis and a cross-wise slot axis (e.g., orthogonal to the longitudinal slot axis). As an example, the longitudinal slot axis can be substantially parallel to a side of the base 230 or, for example, a slot may be at an angle to a side of the base 230. Where a slot is at an angle, consider an angle that may be defined by a centerline such as a centerline defined by the arm 260 where the longitudinal slot axis can intersect the centerline to define an angle. In the example shown in FIG. 1, the angle of the longitudinal slot axis is approximately 90 degrees to the centerline; whereas, a slot may be provided in a base with a slight tilt angle that is less than 90 degrees and, for example, greater than approximately 40 degrees. In such an example, the display surface 404 of the mobile device 400 may be angled toward a centerline of a user that is positioned in front of the base 230, for example, consider a position where a user may utilize the keyboard 320 for touch typing, etc., where information is rendered to the display surface 144 and optionally rendered to the display surface 404 of the mobile device 400.

As shown in the example of FIG. 1, the display surface 144 may be centered along a centerline of the computing device 100 and may be disposed at an angle that can be defined by the base 230 or a flat support surface such as a desktop, a tabletop, a countertop, etc., where the base 230 or the flat support surface can be planar and horizontal. As shown, the arm 260 rises from the base 230 at an angle that may be normal to the base 230 or the flat support surface (e.g., a 90 degree angle). As to an angle of the display surface 144, it may be 90 degrees, greater than 90 degrees or less than 90 degrees. As to the display surface 404 of the mobile device 400 as positioned with respect to the slot 234, it may be at an angle that is greater than 90 degrees such that it is tilted upwardly in a direction that can correspond to the direction of a user positioned in front of the computing device 100. For example, consider a direction that is substantially aimed at a height of a user's eyes.

As an example, a user may have a viewing zone that can be defined by limits such as an upper limit that corresponds to an angle of zero degrees and a lower limit that is measured downwardly from the upper limit. As an example, the viewing zone may have an optimal range of angles where, for example, the optimal range has a lower limit.

As an example, an optimal viewing angle for eyes may be defined according to the International Standards Organization (ISO ergonomics standards 9241-5). ISO 9241-5 states that an optimal viewing angle, or resting angle, is a −35 degree downward gaze angle from the horizon (e.g., at the level of the eyes). ISO 9241-5 also states that the optimal display placement is in a range of +/−15 degrees from the resting angle (e.g., −20 degrees to −50 degrees). Using the ISO 9241-5, a display surface may be optimally placed to be in a range of −20 degrees to −50 degrees relative to the horizon. The ISO 9241-5 range tends to be a bit lower than most users are accustomed for computer work, but is near a "normal" reading position as used by humans for many years. In this "normal" reading position, a display surface may be more appropriately called chest-height rather than head-height.

As to specific upper and lower limits of ISO 9241-5, it allows for a 0 degree horizontal gaze down to a −60 degrees gaze angle; noting that the lower limit of −60 degree angle may result in some amount of neck strain.

As an example, the computing device 100 can include various connectors that can be for one or more of power and data. For example, consider a power supply cable (e.g., a power supply cord) with a connector at a connector end that can be mated with a connector of the computing device 100. In such an example, the power supply cable may be plugged into an electrical outlet and the computing device 100 to supply power to the computing device 100.

As an example, the computing device 100 can be an all-in-one (AIO) type of computing device. As an example, the computing device 100 and/or the stand 200 can include features that allow one or more cables to be easily routed and substantially hidden from view. For example, with a user positioned in front of the computing device 100 as supported by the stand 200 in the orientation of FIG. 1, one or more cables may not be visible due to being hidden by one or more features of the computing device 100 and/or the stand 200. Such an arrangement can provide for a visually pleasing, uncluttered appearance of the computing device 100, the stand 200 and one or more cables as a system.

As an example, a system may be a commercial system that is utilized at a customer service station such as a bank customer service station, a hotel customer service station, a store customer service station, etc. (e.g., consider a kiosk, etc.). Such a system may provide a clean visual experience for a user and a customer. Such a system may provide for clean aesthetic design of the customer service station such that one or more cables do not occupy space on a support surface or occupy minimal space. In such an example, a transaction may occur without annoyance of cable clutter when a user is handing a receipt, a pen, etc., to the customer and/or when the customer is handing a credit card, a smartphone, a smart card, etc., to the user.

As an example, the slot 234 may be a smart slot that includes a reader that can receive data from the mobile device 400. For example, consider an electronic payment reader that includes circuitry (see, e.g., communication circuitry 250) that can receive payment information form the mobile device 400 and/or that may transmit payment information to the mobile device 400. In such an example, a customer may make a transaction with or without assistance from a user in that the customer may hand the mobile device 400 to a user that places the mobile device 400 in the slot 234 or in that the customer is the user and places her mobile device 400 in the slot 234. As an example, a user can make selections using the display surface 144 and/or a peripheral (e.g., a scanner, etc., which may be the mobile device 400) and then make a payment (e.g., a transaction) using the mobile device 400 as inserted at least in part in the slot 234. In such an example, the user may see information rendered to the display surface 144 and to the display surface 404 to confirm that the payment was properly made. In such an example, the user may touch the display surface 404, if and/or when appropriate, to make one or more selections (e.g., to receive an emailed receipt, to confirm a transaction, etc.).

As an example, a customer/user can make various selections on the display surface 144 and place the mobile device 400 (or other smart device) in the slot 234 where the customer/user can see both display surfaces 144 and 404 and make a transaction (e.g., touching either display surface, etc.). As an example, consider a hotel self-check-in example where a hotel includes the computing device 100 with the stand 200, a user enters info on the display surface 144 with the mobile device 400 in the slot 234, and "pay" circuitry is utilized for a transaction. As another example, consider shopping using the mobile device 400 (e.g., as a scanner), placing the mobile device 400 in the slot 234 where the computing device 100 receives via circuitry the shopping list, and where "pay" circuitry makes the transaction.

As an example, as to cable management, the stand 200 can include an outer shell that can lift up to reveal a channel (or channels) for one or more cables. In such an example, one or more cables can be laid in the channel (or channels) and the stand shell can be re-positioned capturing the one or more cables and hiding them from view. As an example, the computing device 100 and/or the stand 200 can include cable management features that allow for easy cable routing, without having to thread connector ends through one or more openings. As an example, cable management can be performed where neither end of a cable needs to be disconnected from the computing device 100 or peripheral, electrical outlet, etc., to be routed through the stand. For example, one or more cables can be slid into the channel from a side opening and exit through an opening at a bottom (e.g., on the shell) when it is closed.

Figure 2:
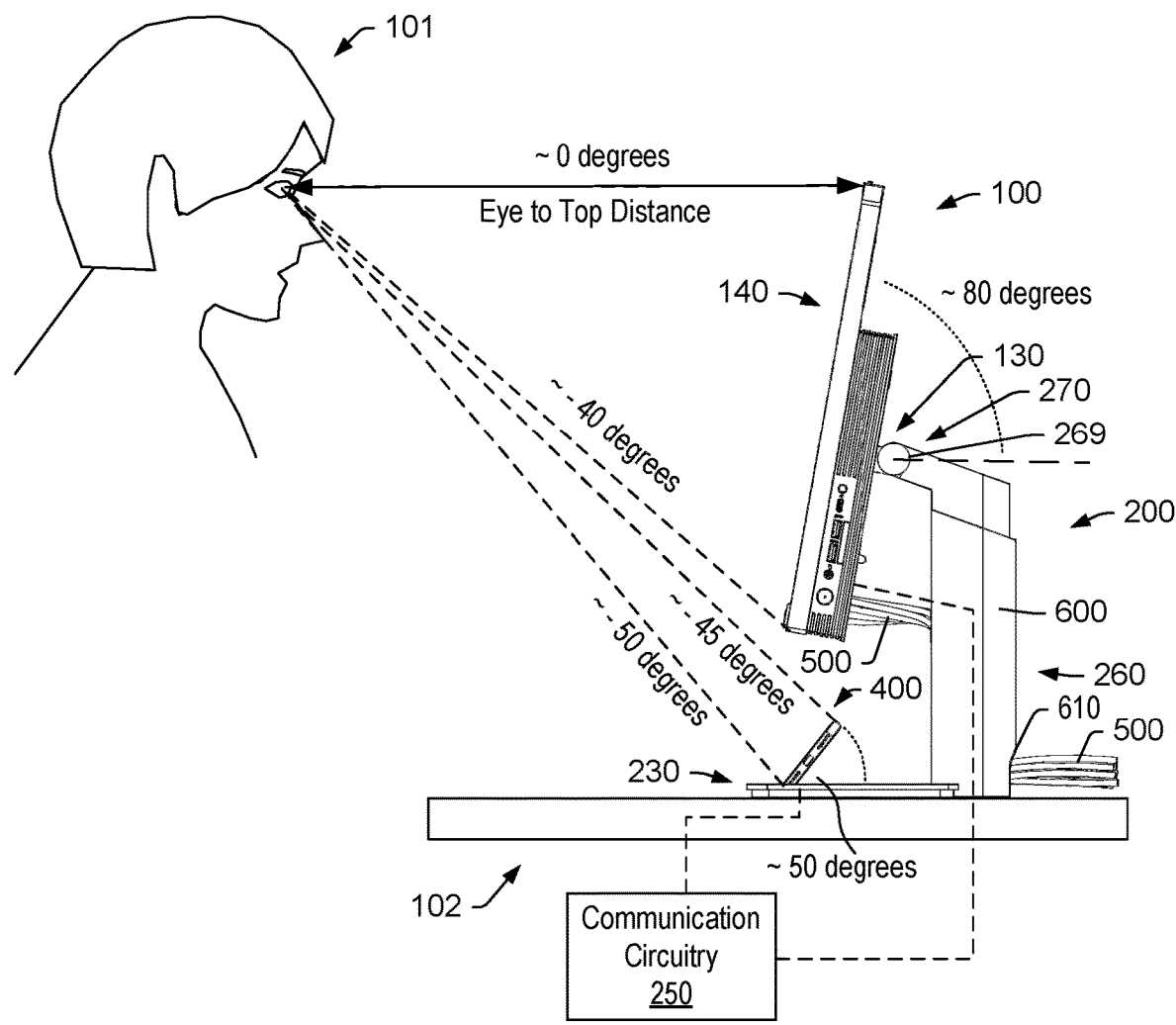
FIG. 2 is a side view of an example of the display device of FIG. 1.

FIG. 2 shows a side view of the device 100 with respect to a user 101 and a support surface 102. The position of the user 101 is given as an example, noting that a user may be positioned closer, further, higher or lower than the user 101 with respect to the device 100 and/or the support surface 102 may be positioned closer, further, higher or lower that the position shown with reference to the user 101.

In the example of FIG. 2, the display surface 144 of the display housing 140 is at an angle of approximately 100 degrees with respect to horizontal (see, e.g., angle of approximately 80 degrees as measured to the back side of the display housing 140) and the display surface 404 of the mobile device 400 is at an angle of approximately 130 degrees with respect to horizontal (see, e.g., angle of approximately 50 degrees as measured to the back side of the mobile device 400); thus, the angle of the display surface 404 of the mobile device 400 can be greater than the angle of the display surface 144 of the display housing 140. As an example, the display housing 140 can be adjustable via the arm 260, for example, via an arm mount 130 such that the angle may be adjusted. As shown in the example of FIG. 2, the arm 260 is at approximately 90 degrees (e.g., normal to the support surface 102).

As shown in the example of FIG. 2, the arm 260 can include a mount 269 at a free end 270 that couples to the arm mount 130. As shown, the arm 260 extends from the base 230 of the stand 200 to the free end 270 where the arm 260 is coupled to the display housing 140. Such an arrangement of components allows the display housing 140 to be supported on a support surface by the stand 200. As an example, the arm 260 may include a flange that can be bolted or otherwise connected to a support. In such an example, the display housing 140 may be supported by the arm 260, optionally without the base 230. In such an example, a free area can exist below the display housing 140, which may provide for clean aesthetics. In such an example, and various other examples, cables 500 can be positioned with respect to the arm 260 optionally without having to disconnect either end of any particular cable. For example, a shell 600 can be movable to expose one or more channels through which one or more of the cables 500 can be routed and then the shell 600 can be movable to hide at least a portion of each of the one or more of the cables 500 in one or more of the one or more channels. As shown in the example of FIG. 2, an area in front of the arm 260 and below the display housing 140 can be "cable-free", which can act to declutter a workspace (e.g., and provide for clean aesthetics). As shown, the cables 500 can exit via a bottom opening 610 in the shell 600.

As to the user 101, various examples of view angles are illustrated, which include a range from approximately 0 degrees to approximately −40 degrees for the display surface 144 and a range from approximately −45 degrees to approximately −50 degrees for the display surface 404 of the mobile device 400. In the example of FIG. 2, both display surfaces 144 and 404 may be considered to be within the range of 0 degrees to −60 degrees of the aforementioned ISO 9241-5 specifications.

FIG. 2 also shows the cables 500 as being routed through the arm 260 of the stand 200 where the cables 500 are at least in part covered by the shell 600, which, as mentioned, can be positionable in different orientations such as an open orientation and a closed orientation. As shown in FIG. 2, the user 101 may not see the cables 500 when positioned in front of the computing device 100 and the stand 200 where the user 101 is centered along a centerline of the computing device 100 and the stand 200. In such an example, the display surfaces 144 and 404 may be viewed without visual distraction from the cables 500. As shown, the cables 500 may bridge the computing device 100 and the arm 260 at an elevation that is blocked from view by the display housing 140. As shown, the cables 500 can exit the arm 260 at a back side such that the cables 500 extend away from the stand 200.

Figure 3:
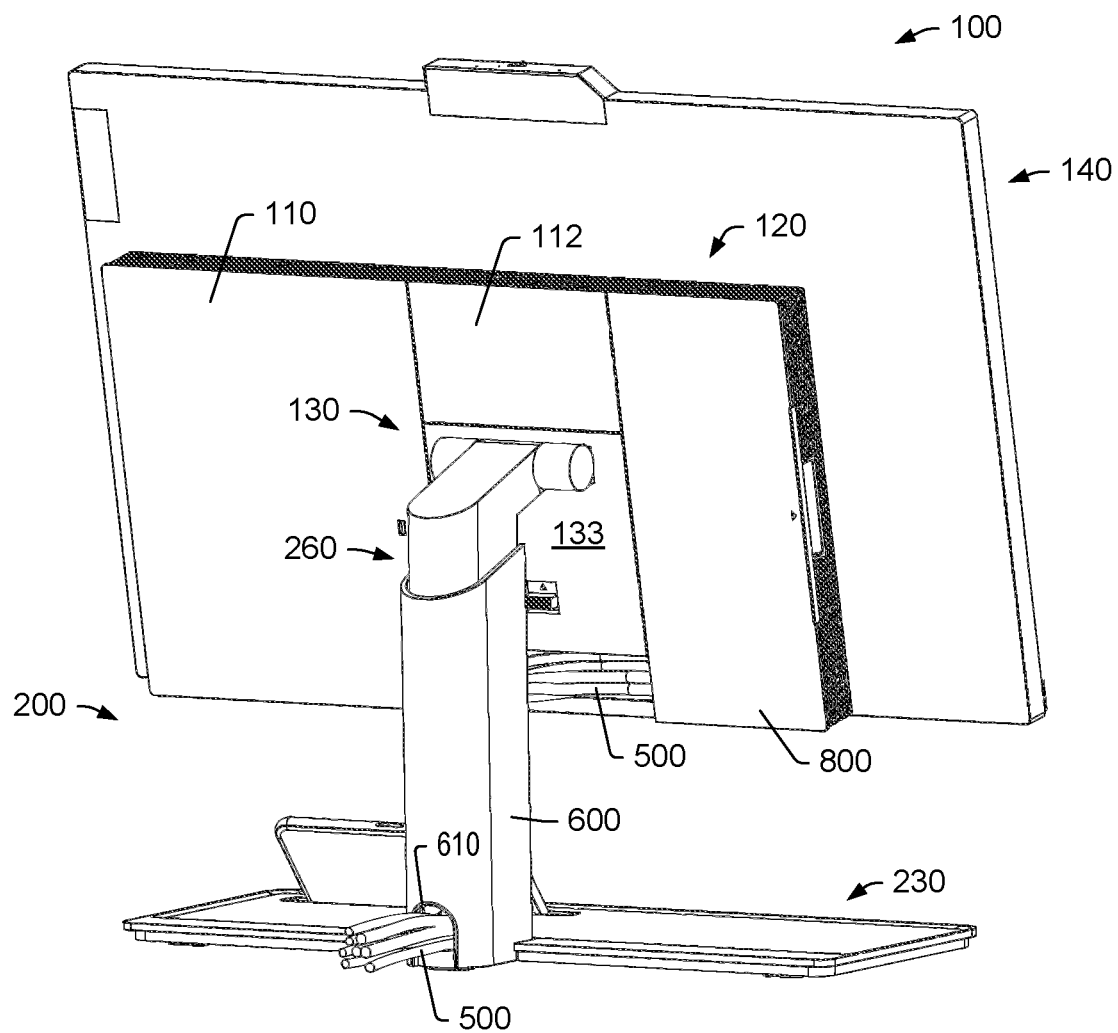
FIG. 3 is a back view of the display device of FIG. 1.

FIG. 3 shows a perspective view of the back side of the computing device 100 and the stand 200 where the computing device 100 includes housings 110, 112, 120, and 133 where the housing 120 includes a cover 800. As shown, the cables 500 are hidden in part by the shell 600 and in part by the cover 800.

Figure 4A:
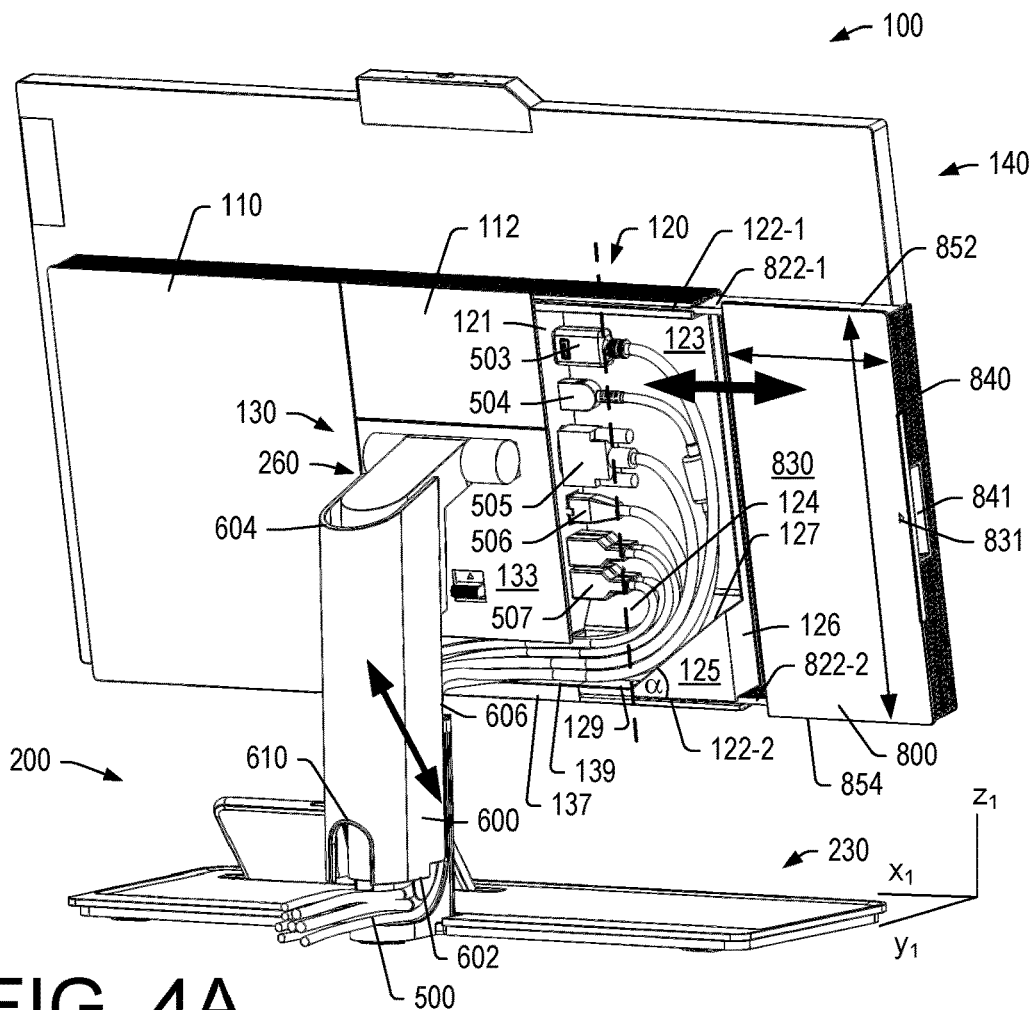
FIG. 4A and FIG. 4B are a series of views that include a back view of the display device of FIG. 1 and side views of the display device of FIG. 1.
Figure 4B:
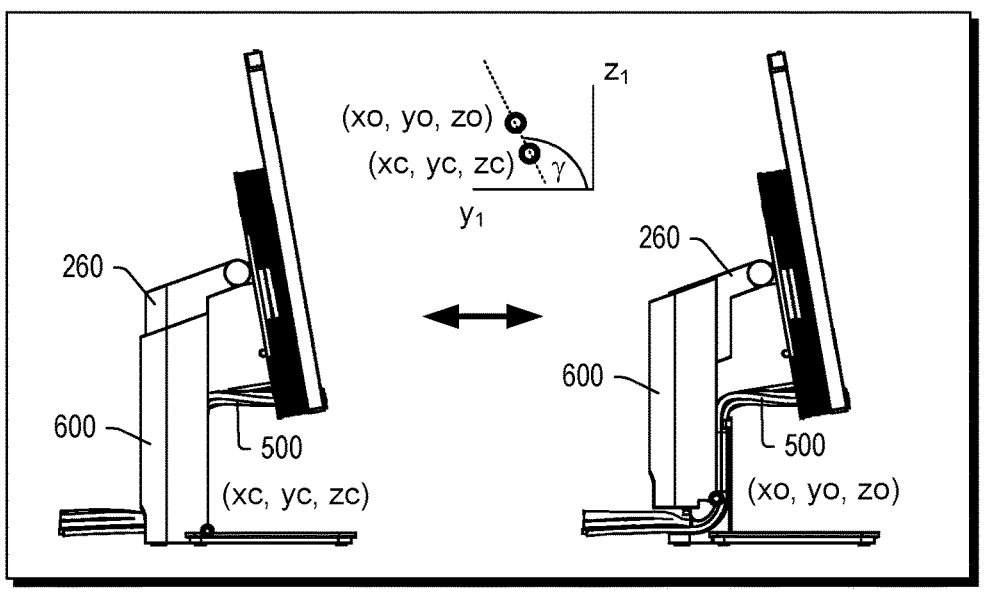

FIG. 4A shows a perspective view of the back side of the computing device 100 and the stand 200 with the cover 800 in an open orientation and the shell 600 in an open orientation and FIG. 4B shows two side views of the computing device 100 and the stand 200 with the shell 600 in a closed orientation (left) and in an open orientation (right), along with a plot with $z_1$ and $y_1$ coordinate axes.

As shown in FIG. 4A, the cover 800 is translatable from left to right and right to left, for example, in a plane that is parallel to a plane defined by the display surface 144 of the display housing 140. In FIG. 4, the cover 800 is shown in an open orientation where connectors 503, 504, 505, 506, and 507 of the cables 500 are visible along with various examples of features of the housing 120, including a connector side surface 121, slots 122-1 and 122-2, a back surface 123, a sloped guide surface 124, a bulkhead 125 that includes an end surface 126 and a sloped guide surface 127, and an outlet guide surface 129. As an example, an interior cavity of the bulkhead may be utilized as space for one or more components, features, etc.

In the example of FIG. 4A, the cover 800 includes extensions 822-1 and 822-2 that are received by the slots 122-1 and 122-2, a cover wall 830 that includes an indicator 831, an end wall 840 that includes a recess 841, and opposing top and bottom walls 852 and 854. As shown, with the cover 800 in the open orientation, threading a cable through a closed perimeter opening is not required. The cables 500 are shown as being fit into an open cavity of the housing 120 and through an open outlet channel 139 where the open cavity can be closed to two sides using the cover wall 830 and the end wall 840 of the cover 800. As shown, the open outlet channel 139 may be defined in part by a surface of a wall 137, which may be a slotted wall that can receive the extension 822-2 of the cover 800.

As an example, the top and bottom walls 852 and 854 can be received in the slots 122-1 and 122-2 respectively when the cover 800 is in a closed orientation where the slots 122-1 and 122-2 extend inwardly into the housing 112 and the wall 137 to receive the extensions 822-1 and 822-2, respectively. In such an arrangement, the extensions 822-1 and 822-2 do not contact one or more of the cables 500 when the cover 800 is transitioned from a closed orientation to an open orientation or from an open orientation to a closed orientation. In such an example, as contact between the extensions and one or more cables does not occur, the extensions do not rub or wear from presence of one or more cables.

In the example of FIG. 4A, the housing 120 can include an open end portion as can be defined between the bulkhead 125 and the slot 122-1 where one or more of the cable 500 may extend past the end surface 126 when the cover 800 is in the open orientation. In such an example, when the cover 800 is transitioned to the closed orientation as shown in FIG. 3, the end wall 840 can push the one or more cables 500 inwardly toward the connector side surface 121, which may cause one or more of the cables 500 to push against one or more of the sloped guide surfaces 124 and 127, which can act to direct the one or more cables 500 along the outlet guide surface 129 and further into the open outlet channel 139. In such an example, the cover 800 and features of the housing 120 can actively help guide one or more cables to appropriate orientations, for example, without a user having to individually or collectively handle the one or more cables. For example, the cover 800 can be utilized as a mechanism that, upon closing, automatically forces one or more cables into an appropriate configuration. In the example of FIG. 4A, the sloped guide surface 127 may be sloped at an angle α that is an angle in a range from approximately 5 degrees to approximately 85 degrees, from approximately 20 degrees to approximately 70 degrees, from approximately 30 degrees to approximately 60 degrees. As an example, the sloped guide surface may be sloped at an angle of approximately 45 degrees. As an example, the sloped guide surface 127 may be planar and/or curved. As explained with respect to FIG. 5, the sloped guide surface 124 may be defined at least in part by an angle β.

As an example, consider the connector 503 being a HDMI connector of a HDMI cable, which may be operatively coupled to a signal source such as a video player, a cable box, another computing device, etc. Such a cable may be relatively thick due to conductor thickness, insulation, etc., such that it has a relatively large minimum recommended bend radius. As an example, a distance between the surfaces 121 and 126 can be sufficient to accommodate the minimum recommended bend radius of the HDMI cable that includes the connector 503.

In FIG. 4A, a dashed line is shown that is approximately at a length of one or more of the connectors 503, 504, 505, 506 and 507. As shown, the outlet guide surface 129 can have a horizontal dimension that is approximately that of a connector length. As an example, a horizontal dimension of the housing 120 can be a connector length plus a safe bend radius. For example, the cable with the connector 503 bends 180 degrees and can be defined by a safe bend radius that is greater than a minimum bend radius of the cable with the connector 503.

As shown in the example of FIG. 4A, from the connector side surface 121, or from the approximate connector length dashed line, to the open outlet channel 139 adjacent the outlet guide surface 129, or to the juncture between the outlet guide surface 129 and the sloped guide surface 127, each of the cables 500 forms a semi-circle (e.g., a semi-ellipse, semi-oval, etc.) in that a 180 degree turn is formed. As an example, connector types that tend to have thicker cables and/or larger minimum recommended bend radii can be positioned closer to the top of the surface 121 while connectors that tend to have thinner cables and/or thinner minimum recommended bend radii can be positioned closer to the bottom of the surface 121.

A bend radius can be defined as a minimum radius a cable can bend without damaging it (e.g., kinking, etc.). Generally, a smaller radius cable tends to have a greater flexibility and a greater bend radius. As an example, a minimum bend radius can be the radius below which an object should not be bent. As an example, minimum bend radius of a cable may be, as an example, dependent upon cable diameter (e.g., cable radius).

In the perspective view of FIG. 4A, the shell 600 is shown in an open orientation and as including opposing ends 602 and 604 (e.g., a bottom and a top), an edge 606 (e.g., a front edge) and a rear opening 610, which is shown as a bottom end opening (e.g., an opening of the bottom end 602 such that the cables 500 can emerge from the shell 600 at a level that can be at least in part above the lowermost portion of the bottom end 602 of the shell 600). In the examples of FIG. 4A and FIG. 4B, due to open channels, the cables 500 may be routed without being disconnected from the computing device 100. As an example, the shell 600 can be transitioned to a closed orientation as shown in FIG. 3 and in the side view of FIG. 4B (left) and the cover 800 can be transitioned to a closed orientation, for example, by translation. As illustrated, various spaces can become closed spaces, for example, an open channel can become a closed channel where it is closed on four sides where at least one of the sides is defined by the shell 600 or the cover 800.

In the side views of FIG. 4B, a reference point is shown on the shell 600, which can be defined in a Cartesian coordinate system, for example, consider the $y_1$ and $z_1$ coordinate system where the reference point of the shell 600 may be plotted in a $z_1$ plane to define an angle g where, in the open orientation of the shell 600, the reference point is at a greater $y_1$ and at a greater $z_1$ position than in the closed orientation of the shell 600. The distance between the reference point in the two orientations can be greater than the diameter of a cable or greater than a sum of diameters of more than one cable (e.g., two or three cables). As an example, the reference point of the shell 600 may move in a straight manner and/or a curved manner. As shown, in the open orientation of the shell 600, the cables 500 are exposed while in the closed orientation of the shell 600, the cables 500 are hidden along a vertical rising portion by the shell 600. For example, in the closed orientation of the shell 600, substantially horizontal portions of the cables 500 can be seen in the side view while substantially vertical portions of the cables 500 are hidden by the shell 600.

Figure 5:
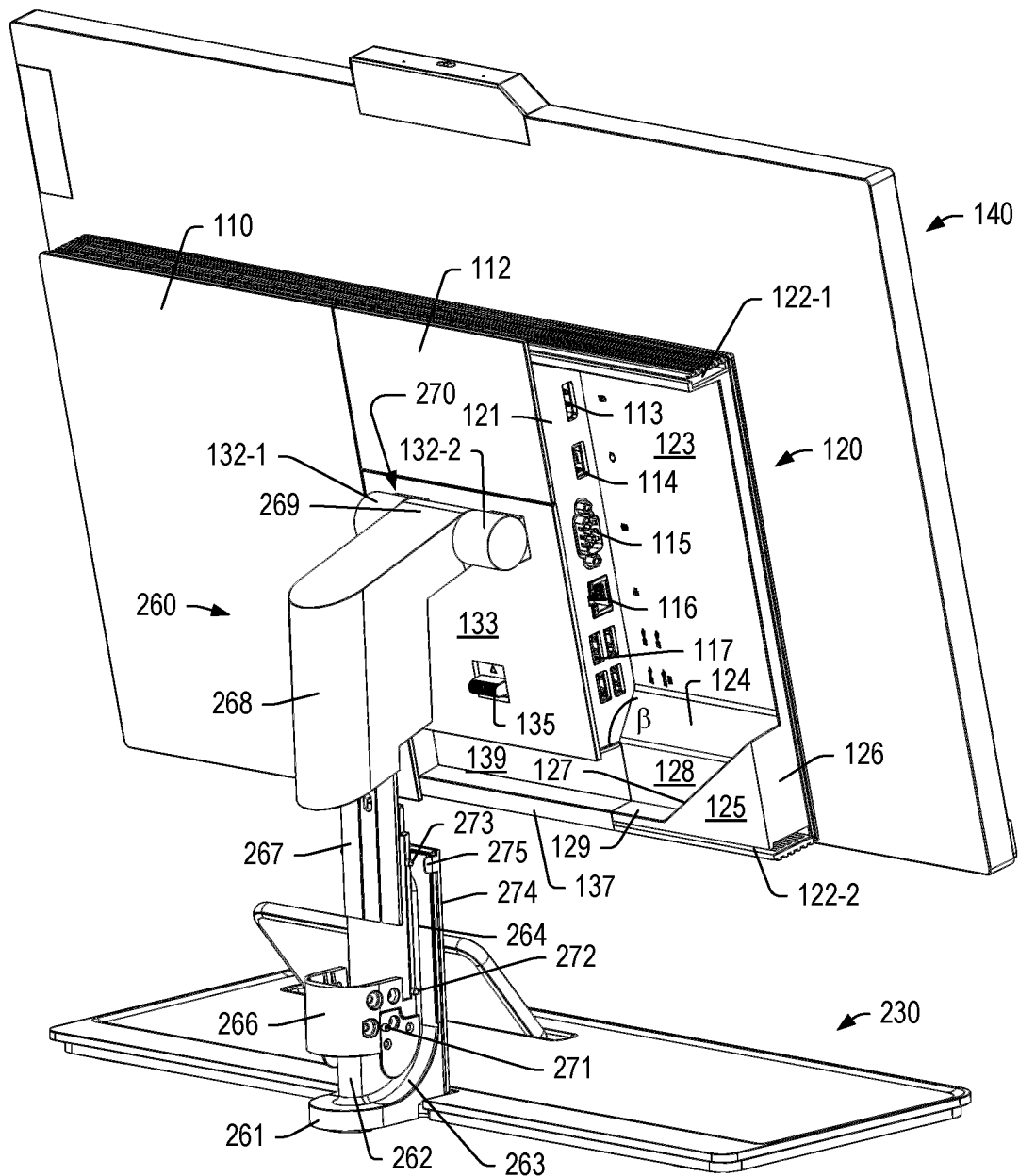
FIG. 5 is a back view of the display device of FIG. 1.

FIG. 5 shows a perspective view of the computing device 100 and the stand 200 without the cables 500, without the shell 600 and without the cover 800. In FIG. 5, an angle β is shown as an angle of the sloped guide surface 124, which can be adjacent to the sloped guide surface 127 and end at a substantially upright surface 128. As explained, one or more cables may be directed in part via one or more sloped guide surfaces such as, for example, the surfaces 124 and 127 to direct such one or more cables to an open channel such as the open outlet channel 139. As shown, the sloped guide surfaces 124 and 127 are positioned at a level that is at least in part below the level of the connectors on the connector side surface 121. As an example, one or more sloped guide surfaces may form a type of funnel shape that helps to funnel one or more cables from a cavity to the open outlet channel 139. As an example, the angle b may be greater than approximately 90 degrees and, for example, be in a range from approximately 90 degrees to approximately 180 degrees or in a range from approximately 100 degrees to approximately 170 degrees.

In the example of FIG. 5, the outlet guide surface 129 can be of a dimension that may be approximately that of a connector. For example, as shown in FIG. 4, the horizontal dimension of the outlet guide surface 129 can be approximately that of a connector length of the connector 503, a connector length of the connector 504, a connector length of the connector 505, a connector length of the connector 506, a connector length of the connector 507.

As shown, the connector side surface 121 includes various connectors 113, 114, 115, 116 and 117 where the connector 113 may be a HDMI type of connector, the connector 114 may be a power type of connector (see, e.g., noise suppressor in FIG. 4, which may be, for example, a ferrite clamp that increases inductance), the connector 115 may be a VGA type of connector, the connector 116 may be a network type of connector (e.g., RJ, etc.), and the connectors 117 may be USB type(s) of connectors. As shown, the connectors 117 may be organized with more than one deep (e.g., two deep) whereas the other connectors 113, 114, 115 and 116 may be organized individually. As mentioned, bend radius can depend on type of cable, diameter of cable, etc. Where minimum recommended bend radius is relatively small and where a connector is relatively small, a more than one deep arrangement may be possible as with the connectors 117.

FIG. 5 also shows a release mechanism 135 that can be utilized to release the computing device 100 from the stand 200, for example, to uncouple the arm mount 130 from the arm 260.

As shown in the example of FIG. 5, the arm 260 can include a lower end 261 (e.g., at least in part at a back of the arm 260), a lower end channel divider 262, a curved side channel 263 and a straight side channel 264; noting that the arm 260 can include another curved side channel and another straight side channel on the opposing side. As shown in the example of FIG. 5, the channel formed by the curved side channel 263 and the straight side channel 264 can be between a front and a back of the arm 260 (see, e.g., FIG. 6A and a dimension $y_a$, which can be a front-to-back dimension of the arm 260 or referred to as a horizontal depth $y_a$ of the arm 260).

As shown in the example of FIG. 5, the arm 260 can include a guide 266, a support 267, a guide 268 and a mount 269. As shown, the guide 268 can include a curved back surface that extends to a sloped upper surface that extends to the mount 269. As an example, a cross-sectional profile of the guide 266 and/or the guide 268 may be approximately the same as a cross-section profile of the shell 600, for example, where the shell 600 is a shell for the guides 266 and 268 (e.g., fitting about at least a portion of the guides 266 and 268 as a close-fitting shell). As an example, the mount 269 can be operatively coupled to the arm mount 130 of the computing device 100 via a pair of mount brackets 132-1 and 132-2. As an example, the mount 269 and the mount brackets 132-1 and 132-2 may be cylindrical and define a pivot axis such that the computing device 100 can be pivoted to change its angle with respect to the stand 200.

As shown in the example of FIG. 5, the arm 260 can include axles 271, 272 and 273 that can provide for guided movement of the shell 600. As shown in the example of FIG. 5, the arm 260 can include a front plate 274 and a prong 275, where the front plate 274 may define in part one or more channels.

Figure 6A:
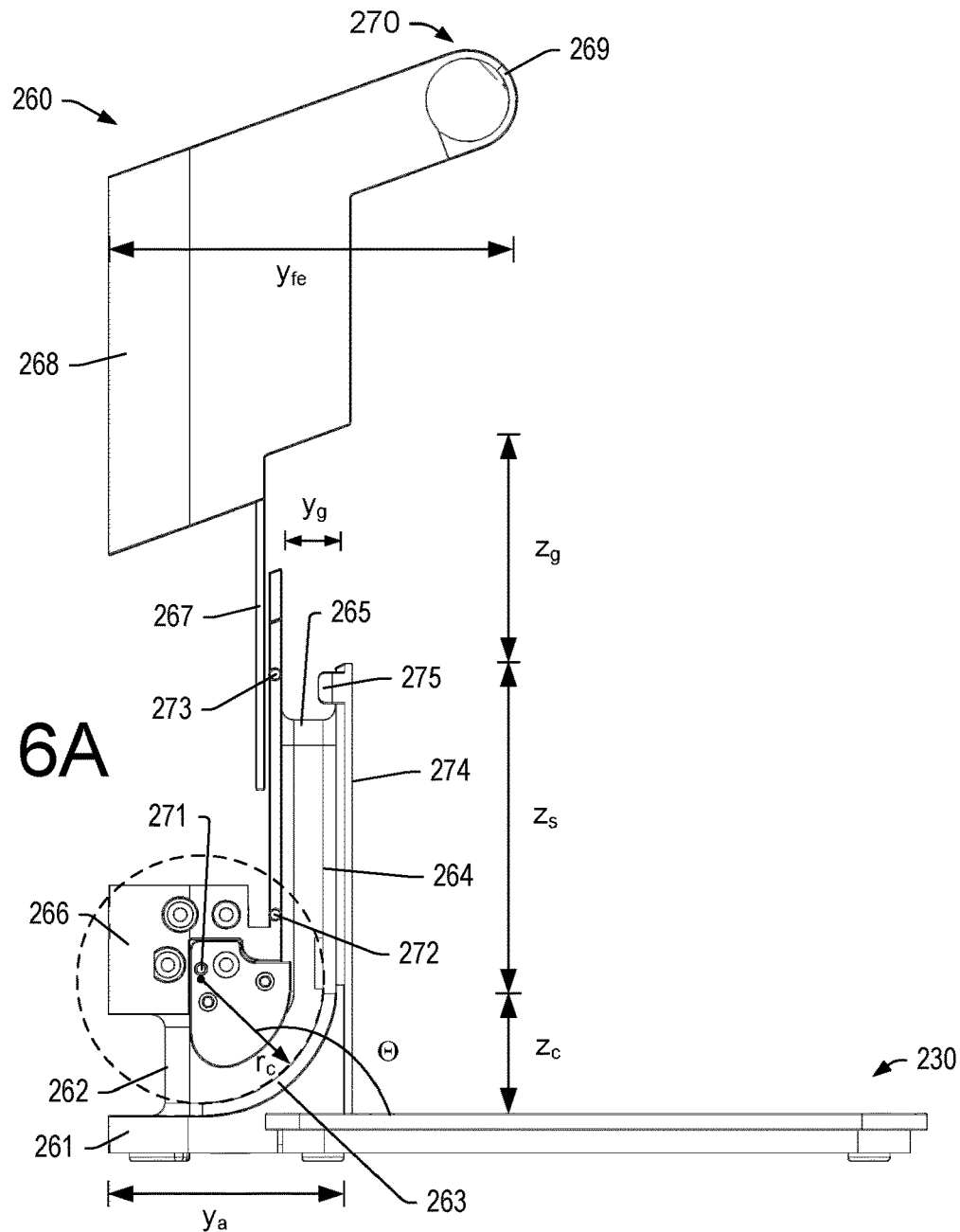
FIG. 6A and FIG. 6B are a side view of an example of a stand and a cut-away view of a portion of the stand along a cutting plane C-C as shown in FIG. 7.
Figure 6B:
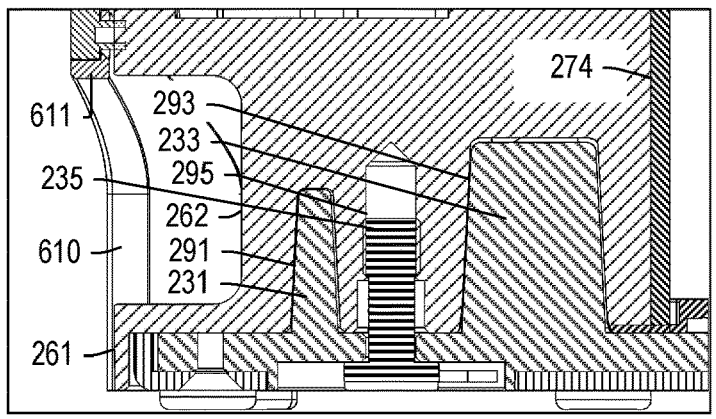
Figure 7:
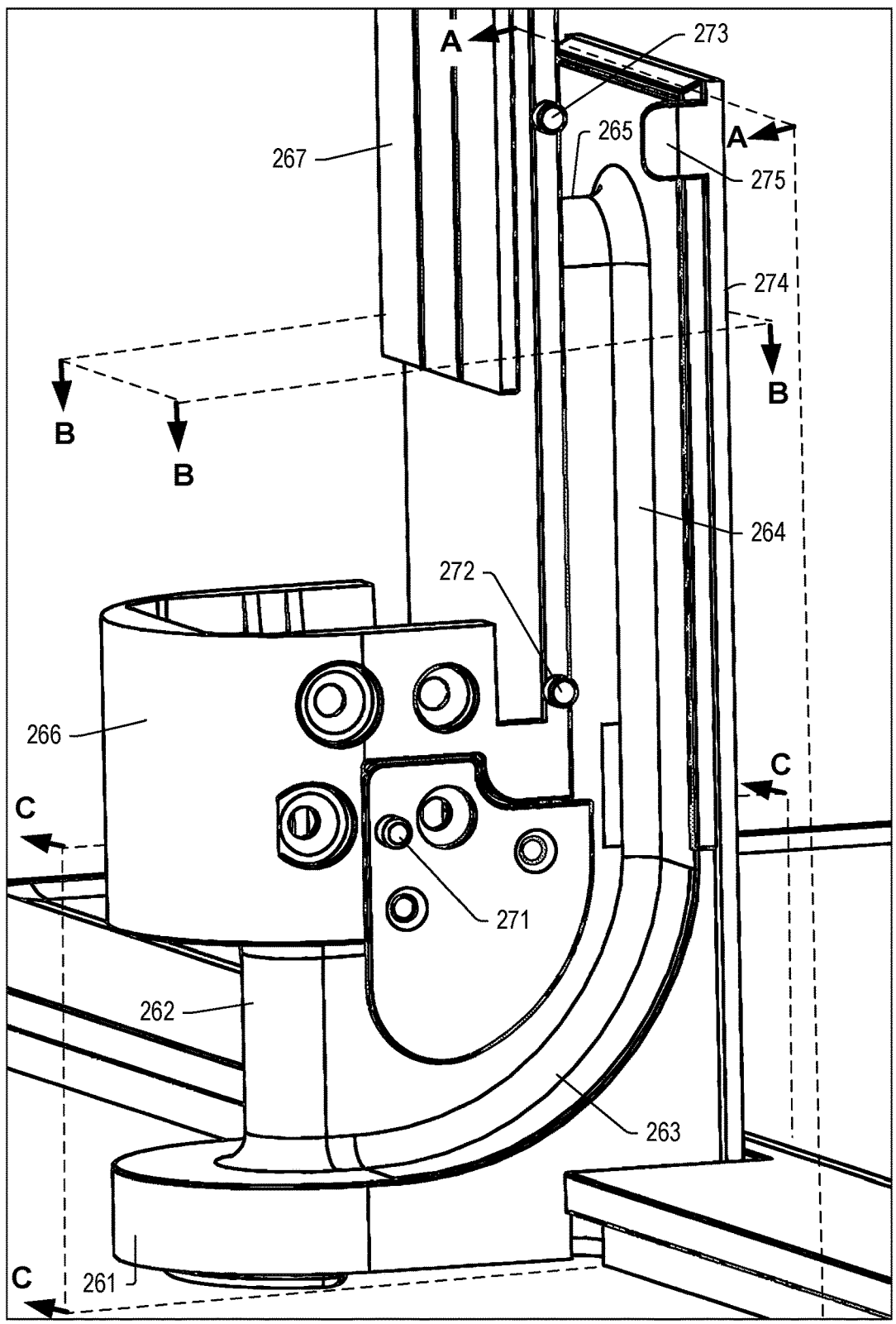
FIG. 7 is a perspective view of a portion of the stand of FIG. 6A.

FIG. 6A shows a side view of the stand 200 without the shell 600 and FIG. 6B shows a cut-away view of a portion of the stand 200 along a cutting plane C-C, as shown in FIG. 7. As shown, the arm 260 extends from the base 230. In the example of FIG. 6A, an upper end channel divider 265 is shown, which may be akin to the lower end channel divider 262. For example, the arm 260 can include opposing channels that meet at the lower end channel divider 262 and at the upper end channel divider 265 where one or more cables may be routed into either of the channels. As shown, the curved channel 263 provides for bending a cable by approximately 90 degrees such that the cable may exit the arm 260 at a back side in a manner substantially parallel to the base 230. In the example of FIG. 6A, a gap is provided between a lower end of the guide 268 and the upper end channel divider 265 that is sufficient to receive a plurality of cables such as the cables 500. As an example, an arrangement can include one or more cables routed through one side channel and one or more cables routed through another, opposing side channel of the arm 260 of the stand 200.

FIG. 6A also shows various examples of dimensions, including a radius $r_c$ of the curved side channel 263 (e.g., a radius of curvature), a vertical height $z_c$ of the curved side channel 263, a vertical height $z_s$ of the straight side channel 264, a vertical height $z_g$ of a gap, a horizontal depth $y_g$ of the gap, the horizontal depth $y_a$ of the arm 260 (e.g., as mentioned with respect to FIG. 5), and a horizontal depth $y_{fe}$ of the arm 260, which is from the back of the arm 260 to the free end 270 of the arm 260. As shown, the free end 270 is fore of the front plate 274 such that a display device such as the display housing 140 can be mounted to the free end 270 and, for example, optionally pivoted about a pivotable coupling (e.g., axis into/out of the page in FIG. 6A) to optionally rotate the display device to an angle that may be greater than 90 degrees from horizontal with reference to the angle of approximately 80 degrees as shown in the example of FIG. 2. As an example, when rotated to an angle that is greater than 90 degrees, the cables 500 can still be received by the stand 260 (see, e.g., the gap $z_g$ of FIG. 6A) while remaining hidden from the view of the user 101 by the display housing 140.

As an example, the horizontal position of the shell 600 in the open orientation can be determined by position of one or more of the axles 271, 272 and 273. For example, the axles 272 and 273 can be referred to as fore axles while the axle 271 can be referred to as an aft axle where the fore axles determine a foremost position of the shell 600 in the open orientation, which can be slightly fore of the fore axles 272 and 273, which provides for access to the straight side channel 264 and at least a portion of the curved side channel 263; where vertical lift of the shell 600 can provide access to another portion of the curved side channel 263. As explained, vertical lift can be to expose a portion of the curved side channel 263 and horizontal shift can be to expose the straight side channel 264 (e.g., a vertical side channel) and a portion of the curved side channel 263.

While the straight side channel 264 is illustrated as being substantially normal to a plane defined by the base 230, such a channel may be at an angle, for example, consider an angle in a range from approximately 30 degrees to approximately 150 degrees. In the example of FIG. 6A, the side channel formed by the curved side channel 263 and the straight side channel 264 is substantially J-shaped.

As explained with respect to the example of FIG. 6A, the arm 260 can include opposing side channels separated by a divider that extends at least in part vertically and may also extend in part horizontally. As shown, the arm 260 has a vertical portion that can support the computing device 100.

As mentioned, a cable can be characterized by a minimum recommended bend radius, which may be a minimum bend radius plus a safety margin where, below the minimum bend radius, cable damage is likely (e.g., kinking, etc.). In the example of FIG. 6, the radius $r_c$ of the curved side channel 263 can be greater than the minimum recommended bend radius of cables that include connectors such as one or more of the connectors 503, 504, 505, 506 and 507. As an example, the radius $r_c$ may be matched to a dimension of the housing 120, for example, consider a length of a connector plus the radius $r_c$ such that a cable that fits into the housing 120 can also fit into the curved side channel 263 without violation of a minimum recommended bend radius.

As shown in the example of FIG. 6A, the radius of curvature of the curved side channel 263 can define a focus that is a point from which the radius of curvature can be measured. The focus can define a focus angle θ with respect to a mid-point of the curved side channel 263, which is shown to be approximately 135 degrees. As an example, a direction of the shell 600 can be less than approximately 135 degrees such that, in the open orientation, the shell 600 moves vertically more than it moves horizontally.

In the example of FIG. 6B, a portion of the stand 200 is shown with the shell 600 in a closed orientation where the shell 600 may include an insert 611 that defines the bottom end opening 610. As shown, the stand 200 can include various features such as features of the base 230 and features of the arm 260 that can be utilized to couple and secure the arm 260 to the base 230. For example, consider the features 231 and 233 that can be extensions of the base 230 that are received in sockets 291 and 293 of the arm 260. As shown, a bolt 235 may be received in a bore 295 of the arm 260. In such an approach, the extensions 231 and 233 can provide structural support while the bolt 235, when received in the bore 295 of the arm 260, can help to assure that the extensions 231 and 233 are securely received in the sockets 291 and 293 of the arm 260. In such an example, the bolt 235 can be threaded and the bore 295 of the arm 260 can be threaded such that the threads can mate to advance the bolt 235 into the bore 295 of the arm 260. As an example, a user or service provider may decouple (e.g., or recouple) the arm 260 from the base 230 using a driver tool (e.g., a screw driver, a bolt head driver, etc.). In such an example, the arm 260 and the base 230 may be serviced, stored, etc. As an example, the base 230 and the arm 260 may be packaged as separate components of an assembly that can be assembled by positioning extensions of the base 230 (e.g., and/or extensions of the arm 260) into sockets of the arm 260 (e.g., and/or sockets of the base 230) where one or more mechanisms can be utilized to secure such positioned features.

FIG. 7 shows a perspective view of a portion of the stand 200 without the shell 600. Various features may be defined, characterized, etc., with respect to a Cartesian coordinate system, for example, as shown in FIG. 1. As mentioned, the arm 260 can include various symmetrical features. For example, the axles 271, 272 and 274 can have corresponding axles on the opposite side of the arm 260.

Figure 8:
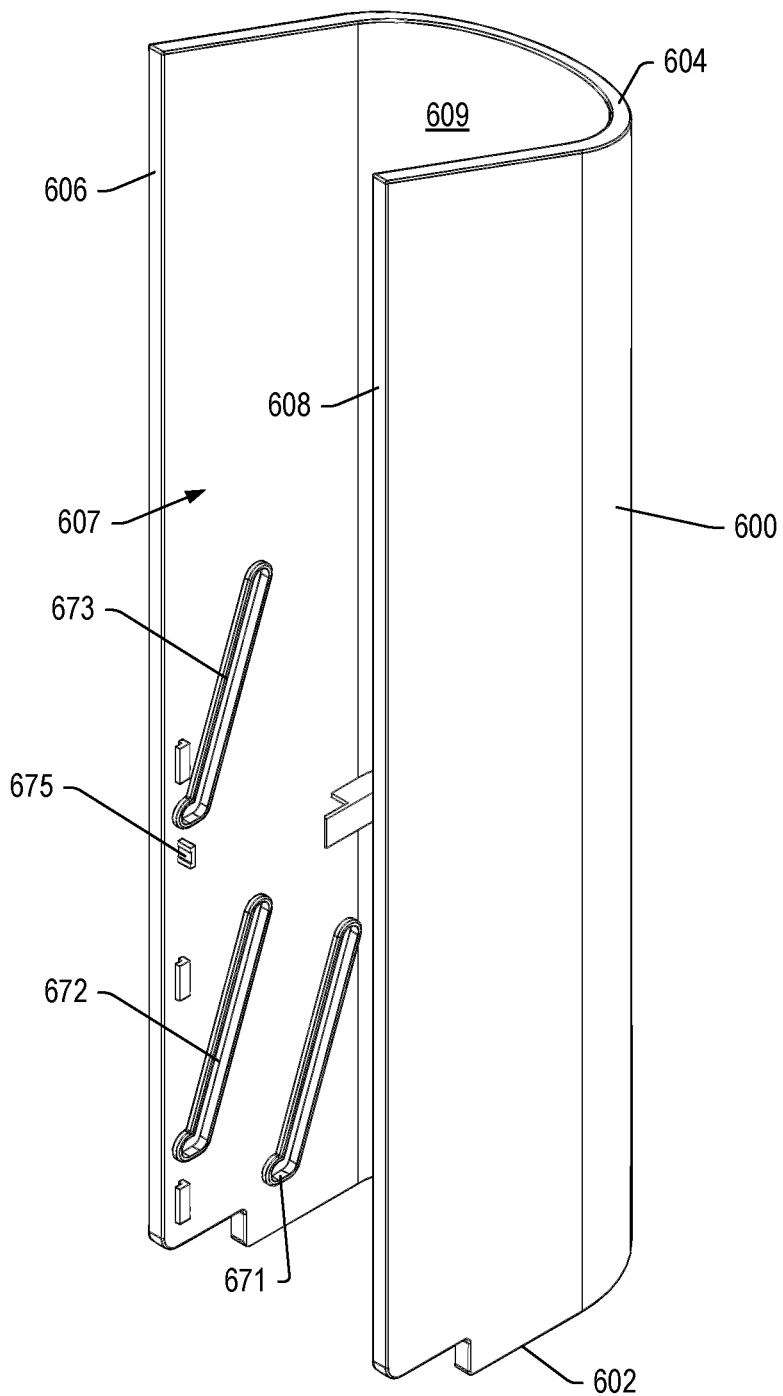
FIG. 8 is a perspective view of an example of a shell.

FIG. 8 shows a perspective view of an example of the shell 600, which includes opposing ends 602 and 604, edges 606 and 608, and tracks 671, 672 and 673 that can receive respective axle ends of the axles 271, 272 and 273. As shown in the example of FIG. 8, the opposing ends 602 and 604 are a bottom and a top, respectively, while the edges 606 and 608 are front edges that define a front opening 607 where the shell 600 extends between the edges 606 and 608 in a curved (or other) manner to define an interior shell space 609 (e.g., a shell cavity). As an example, the shell 600 can be defined as having a closed back and an open front where the open front is an opening to the interior shell space 609 and where the bottom end opening 610 is also an opening to the interior shell space 609. As an example, the shell 600 can be defined as including an interior or inner surface and an exterior or outer surface. As an example, the interior or inner surface can be of a material and/or finished to have a relatively low friction coefficient with respect to one or more cables that may be utilized and at least in part covered (e.g., hidden) by the shell 600. As shown, the shell 600 can include a tab 675 that may cooperate with the prong 275 of the arm 260 to snap-lock the shell 600 in a closed orientation. Such an approach can provide a user with an indication that the shell 600 is properly positioned in a closed orientation with respect to the arm 260 and be of a force that is sufficient to maintain the shell 600 closed while being low enough for decoupling of the tab 675 and the prong 275 to move the shell 600 by hand. As shown in the example of FIG. 8, various features of the shell 600 can be interior features, for example, features of an interior surface or inner surface of the shell 600. In such an example, the exterior surface or outer surface of the shell 600 can be relatively feature-free (e.g., the bottom end opening 610 may be a sole visible feature of the shell 600 when in a closed orientation). Such an approach can provide for clean aesthetics. As to the exterior surface or outer surface of the shell 600, it can be of a material and/or finished to have a suitable friction coefficient for grasping with fingers of a human hand such that a human can move the shell 600 from one orientation to another orientation (e.g., for purposes of positioning, re-positioning, etc., one or more cables). For example, a human may grasp the shell 600 from the back and move it at least in part upwardly away from the base 230 (e.g., where the base 230 is present) or move it at least in part downwardly toward the base 230 (e.g., where the base 230 is present).

The dimensions of the shell 600 can be sufficient to comfortably (e.g., ergonomically) grasp the shell 600 between a thumb of a hand and one or more fingers of the hand (e.g., index and middle finger). For example, consider the shell 600 as having a side-to-side width of approximately 3 cm to approximately 10 cm (e.g., or a side-to-side width of approximately 4 cm to approximately 6 cm). As an example, a shell may have a shape in cross-section that is substantially U-shaped, for example, akin to the shape of a human hand when grasping an object between the thumb and one or more fingers. As an example, a part of a palm of a hand may contact a back of the shell 600 during a transition (e.g., depending on finger length, extension of fingers, etc.). While a U-shape is mentioned, a shell may have a different type of shape such as, for example, an L-shape or a J-shape where, for example, one side channel is provided and/or where a back channel is provided, etc. As an example, a V-shape may be utilized, which can include an apex in cross-section where two substantially straight side walls join at a back and where the two substantially straight side walls form a front opening.

Figure 9:
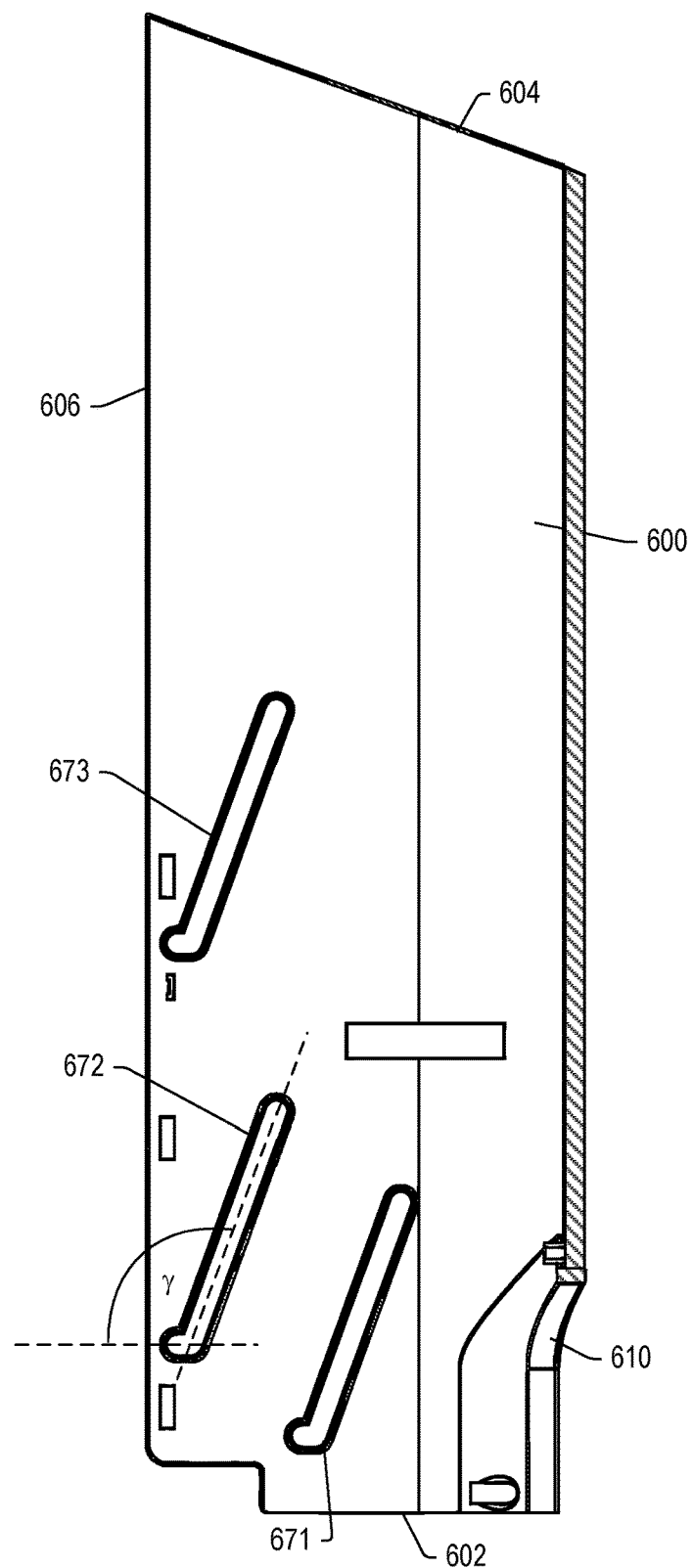
FIG. 9 is a cut-away view of a portion of the shell of FIG. 8.

FIG. 9 shows a cross-sectional view of the shell 600 of FIG. 8 where the opening 610 is shown, which is opposite the edges 606 and 608. The shell 600 can form closed channels with respect to one or both side channels of the arm 260. In the example of FIG. 9, the tracks 671, 672 and 673 can include corresponding tracks on an opposing side of the shell (other interior face). As shown, the shape of the tracks 671, 672 and 673 can be approximately the same where an upper end corresponds to a closed position and where a lower end corresponds to an open position of the shell 600. As shown, the lower ends of the tracks 671, 672 and 673 each include a horizontal portion, which can be utilized to support the shell 600 when open. For example, a transition from closed to open can move the shell 600 at an angle defined by the tracks 671, 672 and 673 and then move the shell 600 horizontally to maintain the shell 600 in the open position (e.g., such that it does not slide back down when orienting one or more cables). As shown, the horizontal portions of the tracks 671, 672 and 673 provide for moving the shell 600 horizontally away from the arm 260, which can provide an additional amount of clearance with respect to the open channels of the arm 260 while also providing for maintaining the shell 600 in the open orientation (e.g., open position). As an example, the shell 600 may be of a mass such that it can slide down under its own weight. For example, friction between axles and tracks may be sufficiently low that once the axles are in the sloped portions of the tracks, the shell 600 slides downwardly where, for example, an additional amount of force may be utilized to lock the tab 675 and the prong 275.

In the example of FIG. 9, the angle γ is shown with respect to the track 672, which includes a horizontal portion and a slanted portion that has a slope with the angle γ; noting that FIG. 4 also shows the angle γ. As an example, the angle γ can be less than approximately 135 degrees such that the shell 600 moves a greater distance vertically than horizontally. The tracks 672 and 673 include ends that are a relatively small distance from the edge 606. As mentioned, the tracks 672 and 673 terminate close to the edge 606 to provide for minimal overhang of the shell 600 and the straight side channel 264 such that, in the open orientation of the shell 600, the straight side channel 264 is open to receive one or more cables, for example, without having to disconnect the one or more cables from corresponding connectors of the computing device 100. As an example, the shell 600 may be defined by a vertical dimension and a horizontal dimension and, for example, a radius of curvature as the shell 600 can be substantially U-shaped (see, e.g., the upper end 604 in FIG. 8).

As an example, the opening 610 may be color coded, for example, finished with a color that differs from the main outer surface of the shell 600. In FIG. 9, the opening 610 is shown as being arched or U-shaped where the opening 610 can have dimensions to accommodate cables that run through one or more channels of the arm 260.

Referring again to FIG. 3, the shell 600 is shown in a closed orientation and in FIG. 4B, the shell 600 is shown in both open and closed open orientations. In FIG. 3, the shell 600 has its lower end 602 below the upper surface 232 of the base 230 and its upper end 604 below the upper sloping surface of the guide 268 of the arm 260. In FIG. 4B, the shell 600 has its lower end 602 above the upper surface 232 of the base 230 and its upper end 604 substantially even with the upper sloping surface of the guide 268 of the arm 260. In such an example, the upper end 604 may be substantially even with the upper sloping surface of the guide 268 to indicate that it is the highest or most open orientation of the shell 600 with respect to the stand 200 (e.g., the arm 260 of the stand 200). As shown, in the open orientation of FIG. 4B, the shell 600 is high enough to provide access to the channel or channels of the arm 260 (e.g., as open channels) such that one or more cables may be arranged without threading through a closed channel.

As indicated in FIG. 3 and FIG. 4B, the shell 600 transitions in a direction upwardly and rearwardly (e.g., backwardly) as the channels of the arm 260 include substantially vertical and substantially horizontal portions. In such an approach, upward movement alone would have to be sufficient to clear the substantially vertical portion and rearward movement alone would have to be sufficient to clear the substantially horizontal portion. Thus, as shown in FIG. 3 and FIG. 4B, movement can be at an angle, which can be defined in part by a horizontal component and defined in part by a vertical component. Such an approach can make the amount of movement minimal while providing adequate open channel access.

Referring again to FIG. 7 and FIG. 8, the number of axles and tracks can be more than one where stability of the shell 600 in the open position is desired. As explained, the number of axles can be six (e.g., three on each side) and the number of tracks can be six (e.g., three on each side).

Figure 10A:
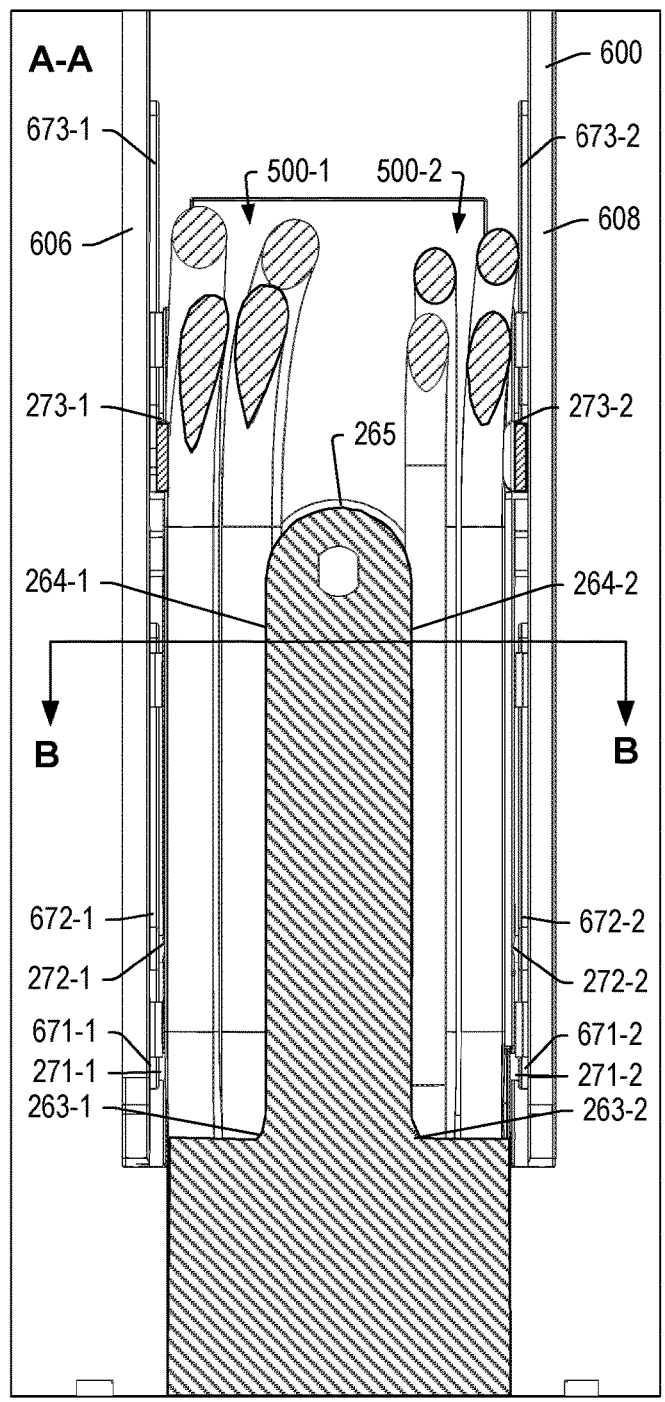
FIG. 10A, FIG. 10B and FIG. 10C are a cut-away view of a portion of an example of a stand with cables along a cutting plane A-A shown in FIG. 7, a cut-away view of a portion of an example of a stand with cables along a cutting plane B-B shown in FIG. 7, and another cut-away view of the portion of the example of the stand with cables along the cutting plane B-B, respectively.
Figure 10B:
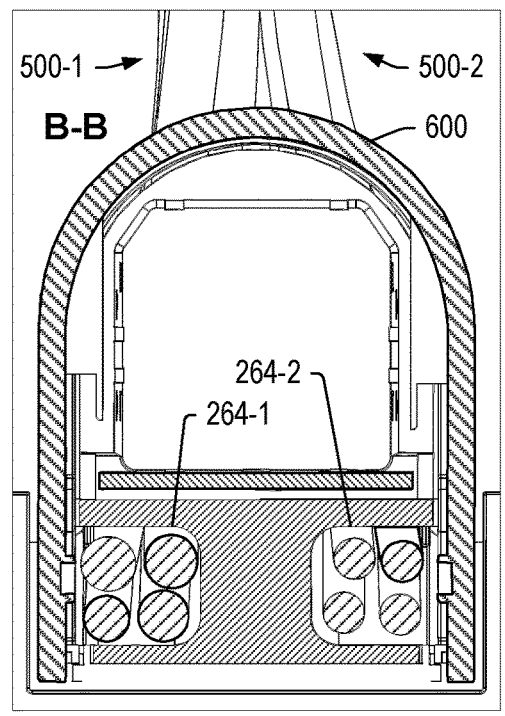
Figure 10C:
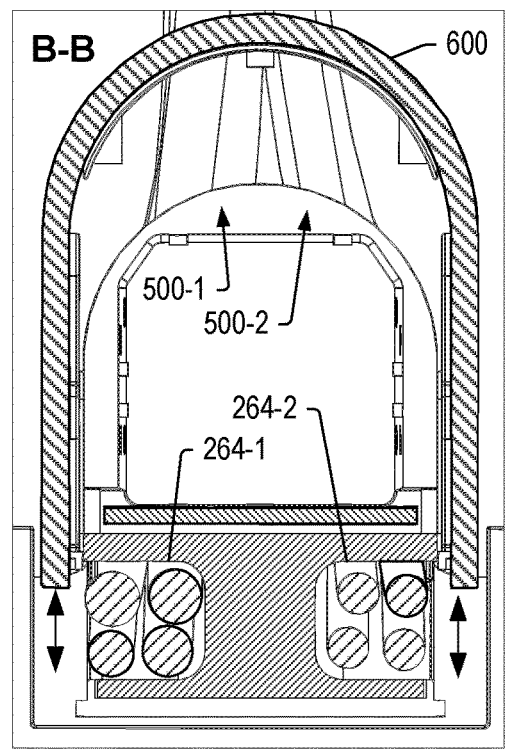

FIG. 10A shows a cross-sectional view of a portion of the arm 260, portions of cables 500-1 and 500-2, and a portion of the shell 600 in the open orientation. The cross-section of FIG. 10A is taken along a cutting plane A-A as indicated in FIG. 7. FIG. 10B shows a cross-sectional view of a portion of the arm 260, portions of cables 500-1 and 500-2, and a portion of the shell 600 in the closed orientation while FIG. 10C shows a cross-sectional view of a portion of the arm 260, portions of cables 500-1 and 500-2, and a portion of the shell 600 in an open orientation. In FIG. 10B and FIG. 10C, the cross-sections are taken along a cutting plane B-B as indicated in FIG. 7 and FIG. 10A.

As shown, each of the side channels of the arm 260 can receive various cables where a horizontal dimension of each of the side channels of the arm 260 can be sufficient to receive, for example, two cables. As an example, an HDMI cable may have a diameter of approximately 0.635 cm (e.g., 0.25 in) such that a horizontal dimension of a side channel of the arm 260 may be greater than approximately 1 cm (e.g., to at least fit an HDMI cable and a smaller diameter cable side-by-side). As an example, a side channel can have a horizontal dimension that is less than approximately 4 cm (e.g., 1.6 in). As an example, side channels may be symmetric. As an example, side channels may be asymmetric. As an example, a stand can include an arm with one side channel. As an example, a stand can include an arm with two side channels. As an example, a side channel can be of sufficient cross-sectional area to accommodate (e.g., receive) more than one cable.

As shown in the example of FIG. 10A, the arm 260 can include curved channels 263-1 and 263-2 that meet at the lower end channel divider 262 and substantially straight channels 264-1 and 264-2 that meet at an upper end channel divider 265. The channels 263-1 and 264-1 can form one side channel and the channels 263-2 and 264-2 can form another side channel where the two side channels can become closed when the shell 600 is in the closed position such that cables running through the channels can be hidden as to portions running through the channels.

As shown in the example of FIG. 10A, the arm 260 can include axles 271-1, 271-2, 272-1, 272-2, 273-1 and 273-2 where the shell 600 can include tracks 671-1, 671-2, 672-1, 672-2, 673-1 and 673-2. As shown the features labeled "-2" are on the side that corresponds to the edge 608 of the shell 600 and the features labeled "-1" are on the side that corresponds to the edge 606 of the shell 600. As shown in FIG. 4, the edge 606 may be closer to the housing 120 than the edge 608. As shown in FIG. 4 and FIG. 10, the cables 500 can include some cables 500-1 that route through the channels 264-1 and 263-1 and can include other cables 500-2 that route through the channels 264-2 and 263-2 where the cables 500-1 and 500-2 come together in a bundle at the lower end channel divider 262. As shown, a bundle of cables may divide into groups at the upper end channel divider 265 and come together to reform the bundle of cables at the lower end channel divider 262 (e.g., or vice versa).

As shown in FIG. 10B and FIG. 10C, the shell 600 can cover the channels 264-1 and 264-2 with the cables 500-1 and 500-2 therein such that the cables 500-1 and 500-2 are surrounded on four lateral sides. As shown, the channels 264-1 and 264-2 may be substantially U-shaped, each having three closed sides and an open side where the shell 600 can close or provide access to the open side. The arm 260 can include a center column that defines the channels 264-1 and 264-2 where a cross-section profile of the arm 260 can be substantially shaped like an I-beam. In the examples of FIG. 10B and FIG. 10C, transitioning the shell 600 from the closed to the open orientation creates gaps, with dimensions indicated by arrows, which can allow for placing a cable or cables into a channel or channels or removing a cable or cables from a channel or channels. In the example of FIG. 10B, the cables 500-1 and 500-2 are hidden in the channels 264-1 and 264-2 while in the example of FIG. 10C, the cables 500-1 and 500-2 are visible as being exposed (e.g., at least the outermost two cables on either side are exposed, etc.).

As an example, an arm can include one or more magnets where, for example, a shell can include one or more magnets. In such an example, the shell may be positionable using magnetic force, which can be magnetic attraction force and/or magnetic repulsion force. For example, consider a pair of bar magnets on opposing sides of a shell and a pair of bar magnets on opposing sides of a portion of an arm that can be covered at least in part by the shell. Such pairs can be opposite in polarity such that the shell is firmly maintained by magnetic attraction forces in a desired position such as that of a closed orientation. In such an example, a portion of the arm and/or the shell can include another pair of bar magnets, which determine a desired position of the shell that corresponds to that of an open orientation, where magnetic attraction forces can maintain the shell in that open orientation. In such an approach, a user may manually overcome magnetic attraction force and move the shell slightly out of one orientation whereby magnetic attraction force associated with magnet(s) of another orientation guide the shell to that other orientation (e.g., and vice versa). In such an example, the arm may or may not include axles and/or tracks (e.g., magnetic forces may act to guide/control movements and positions).

As an example, a device such as the device 100 can be an assembly, which may be packaged as various components or may be packaged as an assembled assembly. As an example, an assembly can include the stand 200 where the stand includes the base 230, the arm 260 that extends from the base 230 to the free end 270 (e.g., the free end 270 of the arm 260), and the shell 600 operatively coupled to the arm 260, where the arm 260 includes a front (e.g., defined by the front plate 274 or another feature), a back (e.g., defined by the lower end 261, a feature opposite the front plate 274, etc.; see also the front-to-back dimension $y_a$ of FIG. 6A) and a side channel disposed between the front and the back, where the side channel can include a curved portion (e.g., the curved side channel 263) and a straight portion (e.g., the straight side channel 264), and where the shell 600 includes a top (e.g., the end 604 being a top end), a bottom (e.g., the end 602 being a bottom end), a front opening (e.g., the front opening 607, as may be defined by the edges 606 and 608), a bottom end opening (e.g., the bottom end opening 610), an open orientation that exposes a portion of the back and the side channel of the arm 260 and a closed orientation that covers the side channel of the arm 260 where the side channel is accessible via the front opening (e.g., the front opening 607) of the shell 600 and is accessible via the bottom end opening (e.g., the bottom end opening 610) of the shell 600; and a display device (see, e.g., the display housing 140, etc.) that includes cable connectors (see, e.g., the connectors 113, 114, 115, 116, 117, etc.) and an arm mount (see, e.g., the arm mount 130) to couple the display device to the free end 270 of the arm 260.

Figure 11:
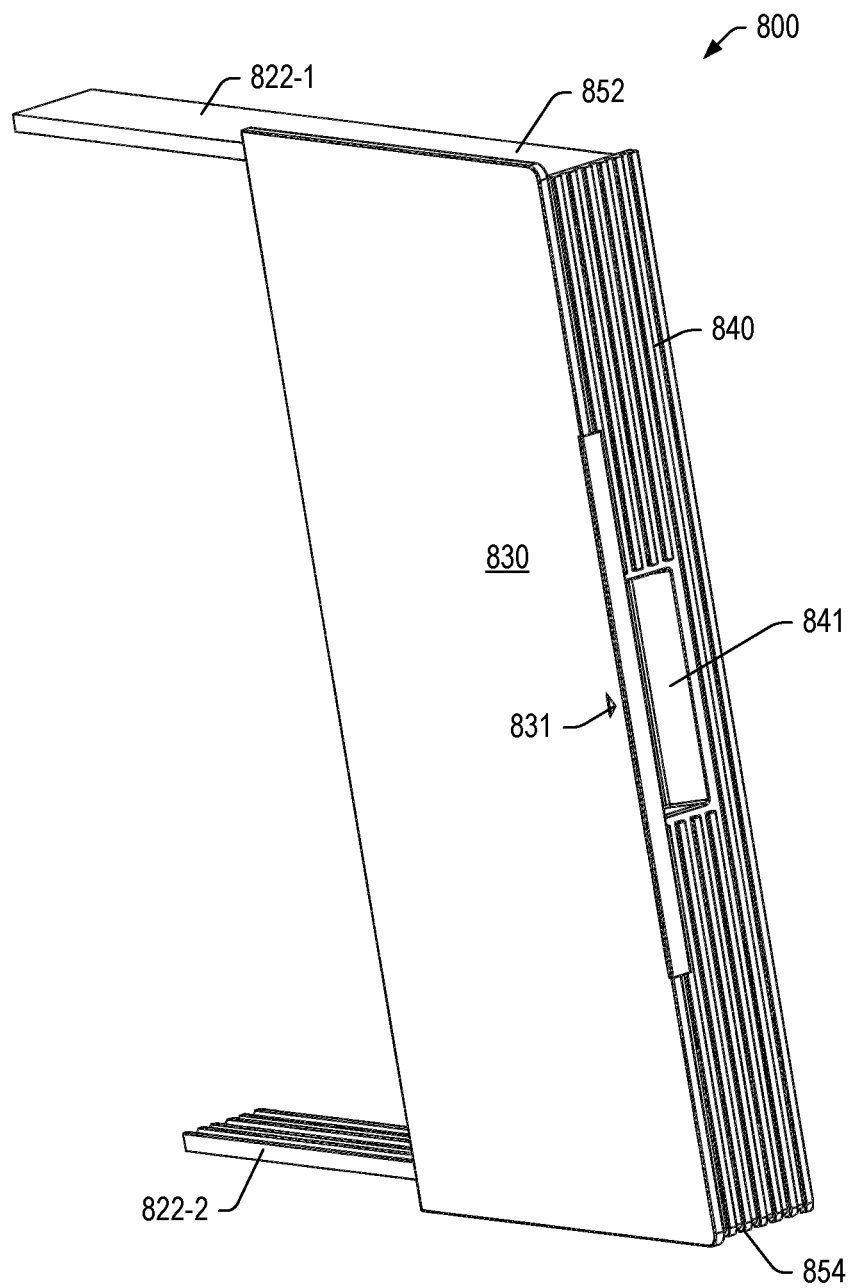
FIG. 11 is a perspective view of an example of a cover.

FIG. 11 shows a perspective view of the cover 800, which, as mentioned, includes the extensions 822-1 and 822-2, the cover wall 830, the indicator 831, the end wall 840, the recess 841 and the opposing top and bottom walls 852 and 854. As shown, the indicator 831 can indicate the recess 841, which may be deep enough to receive a portion of a finger to grip the cover 800 and translate it to an open orientation.

Figure 12:
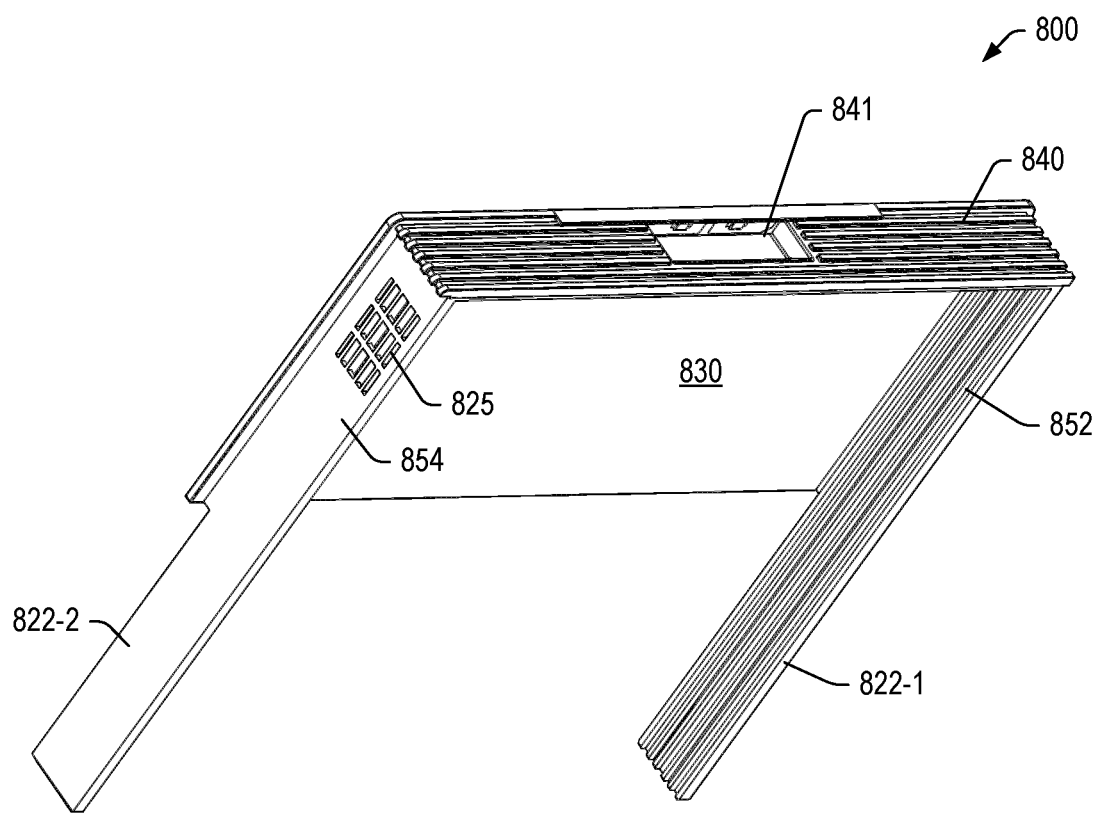
FIG. 12 is another perspective view of the cover of FIG. 11.

FIG. 12 shows another perspective view of the cover 800 where the bottom wall 854 includes a vent 825. In such an example, the vent 825 can provide for communication of air into and/or out of the housing 120 and/or the housing 140. As an example, one or more cables may experience some amount of resistive heating during use and the vent 825 can provide for air flow that can facilitate cooling (e.g., heat transfer) to help maintain the temperature of one or more of the cables 500. As an example, the bulkhead 125 can be a space that is in fluid communication with a space of the housing 140. As an example, the bulkhead 125 can include one or more vents on a lower surface thereof that can substantially align with the vent 825 of the cover 800 when the cover 800 is in the closed orientation. As an example, the bottom wall 854 may include one or more other vents and/or the vent 825 may extend substantially along a length of the bottom wall 854 and/or the extension 822-2 such that when the cover 800 is in an open orientation where the bulkhead 125 is vented, air can flow. For example, if a user leaves the cover 800 in an open orientation, a vented bulkhead may remain open vented for purposes of air flow.

Figure 13:
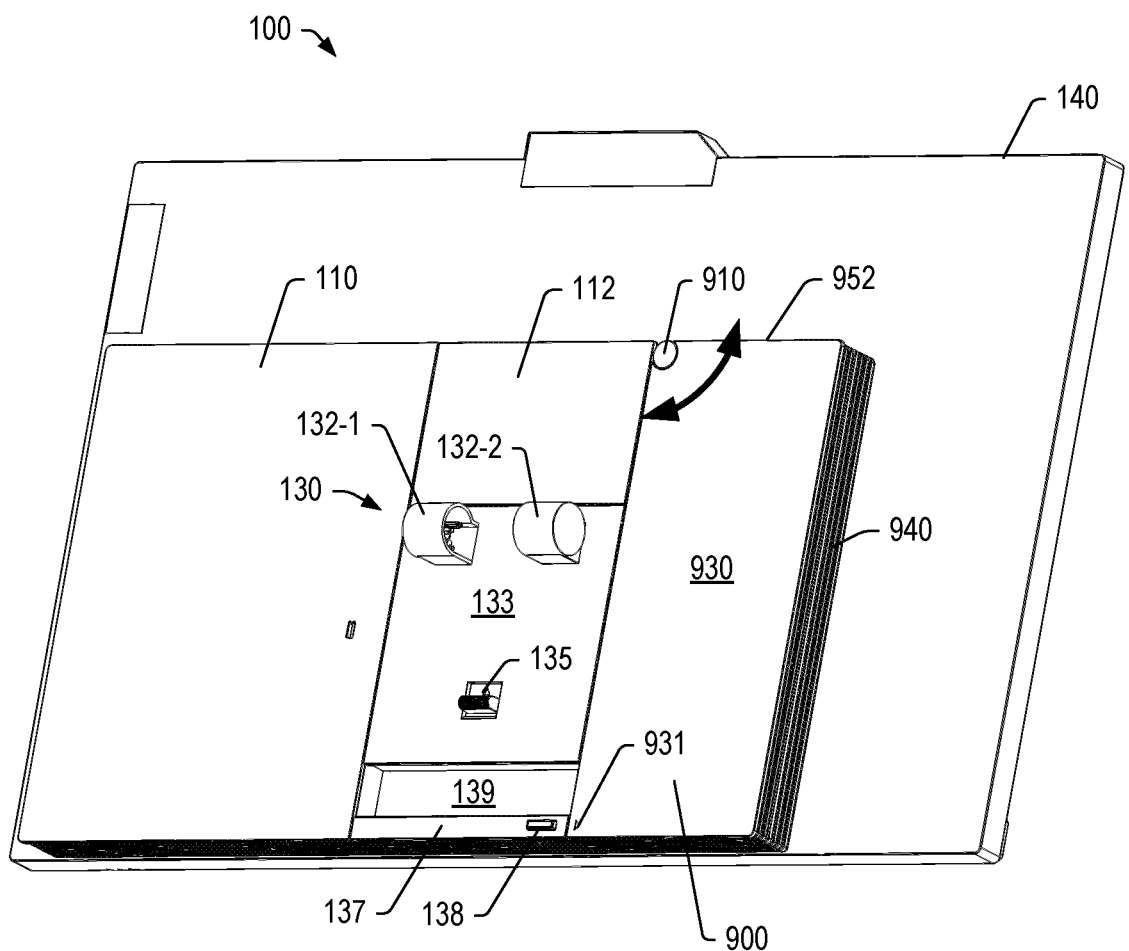
FIG. 13 is a perspective view of an example of a display device.

FIG. 13 shows a perspective view of an example of the computing device 100 where a cover 900 is utilized and where the open outlet channel 139 is defined in part by a wall 137 with an actuator 138 such as a release button. As shown, the cover 900 includes a cover wall 930 with an indicator 931 that, in the closed orientation, is adjacent to the actuator 138, an end wall 940 and a top wall 952. The cover 900 also includes an axle 910 that defines a pivot axis for rotation of the cover 900 such that the cover 900 can be rotated in a counter-clockwise direction in the view of FIG. 13 to transition the cover 900 to an open orientation and, for example, in a clockwise direction to rotate the cover 900 to a closed orientation.

Figure 14:
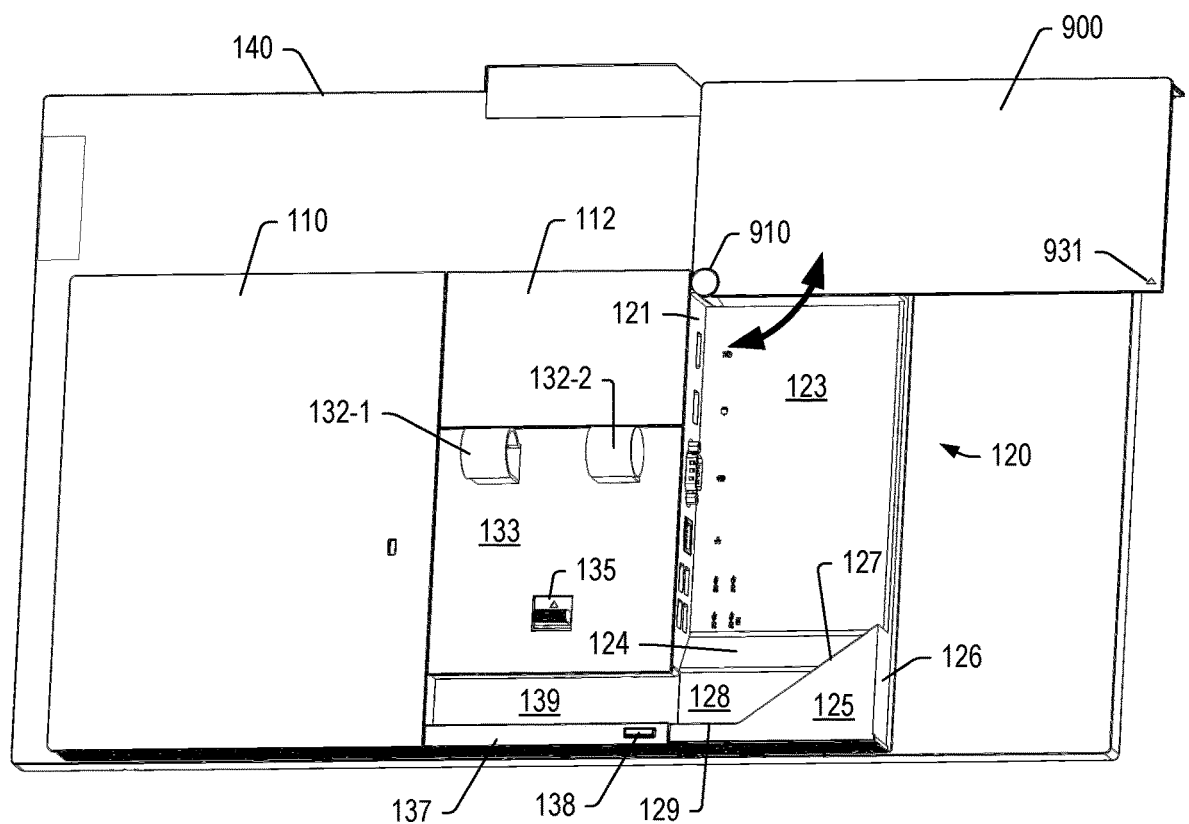
FIG. 14 is a perspective view of the display device of FIG. 13.

FIG. 14 shows a perspective view of the computing device 100 with the cover 900 in an open orientation where it is rotated by approximately 90 degrees with respect to the closed orientation of FIG. 13. As an example, upon transitioning the cover 900 to the closed orientation, the end wall 940 may force one or more cables to contact one or more of the sloped surfaces 124 and 127 to direct the one or more cables further into the open outlet channel 139.

Figure 15:
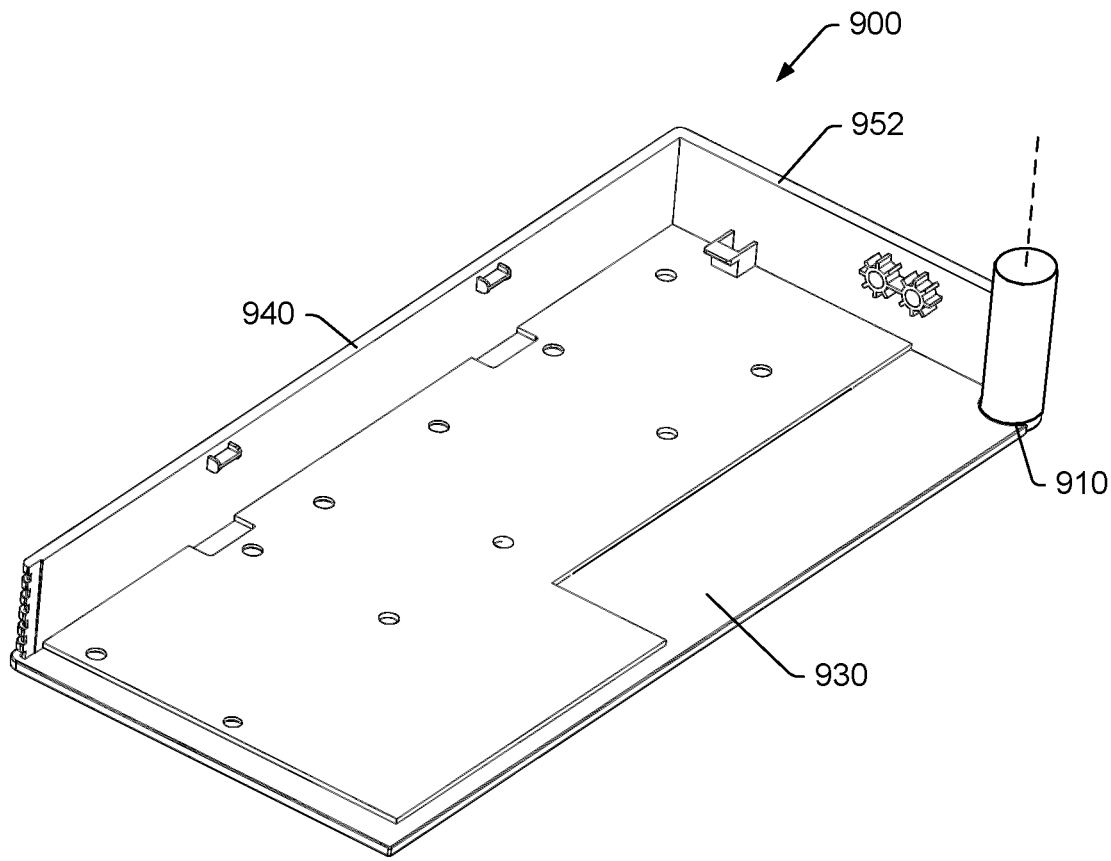
FIG. 15 is a perspective view of an example of a cover.

FIG. 15 shows a perspective view of an example of the cover 900, where the cover 900 can include the axle 910 or, for example, a socket or bore for receipt of an axle.

As an example, a device can be an all-in-one device, that is an assembly that can include a stand that includes a base, an arm that extends from the base to a free end, and a shell operatively coupled to the arm, where the arm includes a front, a back and a side channel disposed between the front and the back, where the side channel includes a curved portion and a straight portion, and where the shell includes a top, a bottom, a front opening, a bottom end opening, an open orientation that exposes a portion of the back and the side channel of the arm and a closed orientation that covers the side channel of the arm where the side channel is accessible via the front opening of the shell and is accessible via the bottom end opening of the shell; and a display device that includes cable connectors and an arm mount to couple the display device to the free end of the arm. In such an example, cables can run through the front opening, the side channel and the bottom end opening. If a user wants to add a cable, the user can connect the cable at both ends, with one of the ends being connected to the display device and the other of the ends being connected to an outlet or another device. The user can then transition the shell from the closed orientation to the open orientation and position the cable in the side channel and then transition the shell from the open orientation to the closed orientation such that the cable runs through the front opening to the display device and runs through the bottom end opening to the outlet or the other device. The user can view the display device from a position in front of the arm and the display device where the added cable can be hidden from view. Such an approach can provide an aesthetically clean work space for the user.

As an example, an assembly can include various cable management features where the assembly can be an AIO device where the cable management features hide connectors and guide cables discretely toward an arm (e.g., a sand neck), which hides and guides the cables out the back, low to a support surface. As shown in various examples, the bottom end opening 610 of the shell 600 guides the cables 500 backwardly at a level that can be proximate to or at a level of a support surface such as a desktop.

As an example, an assembly can include a stand that includes a base, an arm that extends from the base to a free end, and a shell operatively coupled to the arm, where the arm includes a front, a back and a side channel disposed between the front and the back, where the side channel includes a curved portion and a straight portion, and where the shell includes a top, a bottom, a front opening, a bottom end opening, an open orientation that exposes a portion of the back and the side channel of the arm and a closed orientation that covers the side channel of the arm where the side channel is accessible via the front opening of the shell and is accessible via the bottom end opening of the shell; and a display device that includes cable connectors and an arm mount to couple the display device to the free end of the arm.

In such an example, the curved portion of the side channel can be defined by a radius of curvature that is greater than a bend radius of a cable that includes a cable connector that matches one of the cable connectors of the display device. In such an example, the cable can be a video cable with a video cable connector and where the one of the cable connectors of the display device can be a video cable connector. In such an example, consider a VGA cable or an HDMI cable. Such types of video cables can include multiple wires and, for example, shielding and an outer protective sheath.

As an example, an HDMI cable can include a bundle of wires, which may number, for example, nineteen including drain wires. As an example, such a cable can include four primary paired connections which represent the TDMS (Transition Minimized Differential Signaling) channels plus a drain wire (e.g., color, multi-channel audio information and clock). There may be no dedicated wires for audio. As an example, a central pair may be for DDC (Display Data Channel) clock/data which reads EDID (Extended Display IDentification) information from a display and which also handles the HDCP handshaking. EDID can tell an HDMI transmitter what type of signal and display it are involved. As an example, four single wires can be a +5V line, a DDC ground, a hot plug detect wire (a signal that is used to monitor hot plug events so that a new HDCP negotiation can be made), and one for CEC. CEC (Consumer Electronics Control), which is a two-way single wire control system which allows devices connected on an HDMI chain to communicate and automate settings and control functions, reducing the amount of controls and remotes to operate the components. One or more solo wires may be unused.

Shielding can be included in an HDMI cable and an outside PVC jacket. An HDMI cable can include a braided shield, a helical-wrapped aluminum polymeric material, etc. Different shielding can provide for shielding of different frequencies. For example, braid may be better for blocking lower frequency interference and polymeric foil may be better suited for blocking higher frequency interference. As an example, each of the TDMS pairs can include a polymeric wrap and a clock channel can include a polymeric wrap.

As an example, a cable can be a power cable with a power cable connector and one of the cable connectors of a display device can be a power cable connector.

As an example, a side channel can be a first side channel of a first side of an arm and the arm can further include a second side channel of a second, opposing side of the arm. In such an example, the arm can include a divider that separates the first side channel and the second side channel. In such an example, the divider can include an upper divider end and a lower divider end, where, in a closed orientation of the shell, a line of sight exists to the lower divider end through the bottom end opening of the shell. For example, in the view of FIG. 3, without the cables 500 present, the lower divider end 262 may be seen from outside the shell 600 looking into the shell 600 (e.g., to the interior shell space 609).

As an example, a shell can transition between an open orientation and a closed orientation via axles received in tracks. In such an example, each of the tracks can include a horizontal portion and a slanted portion. For example, in the open orientation, the shell can be supported by the axles being received in the horizontal portions of corresponding tracks; whereas, in the closed orientation, gravity may provide a force given the mass of the shell to maintain the shell in the closed orientation. As mentioned, one or more magnets may be utilized for positioning, transitioning, etc., a shell.

As an example, a shell can transition between an open orientation and a closed orientation in a direction that includes a horizontal component and a vertical component, where the vertical component exceeds the horizontal component (see, e.g., the plot of FIG. 4B). As an example, the direction may be an angle less than 135 degrees.

As an example, a shell can be a U-shaped shell. Such a shell can include an outer surface that can be grasped between a thumb and a finger or fingers of a hand where the closed portion of the U-shaped shell is facing a palm of the hand (e.g., the region of the hand between the forefinger and the thumb, etc.).

As an example, a bottom end opening of a shell can be a U-shaped bottom end opening. As an example, a bottom end opening of a shell can be without sharp corners, without sharp protrusions, without sharp edges, etc., such that one or more cables can be in contact with the shell without or with minimal risk of damage to one or more of the cables. As an example, a bottom end opening can include a perimeter that has one or more curves. For example, consider two opposing straight perimeter portions with a curved arched portion that joins them where the bottom end opening has an open perimeter opposed the curved arched portion.

As an example, a display device can include a cover that includes an open orientation and a closed orientation with respect to cable connectors. In such an example, the display device can include a cavity defined in part by a connector side surface where the cable connectors are disposed along the connector side surface. In such an example, the cover can be a translatable cover that translates between the open orientation and the closed orientation. As an example, a cover can be a rotatable cover that rotates between the open orientation and the closed orientation. As an example, a cover may be in part translatable and in part rotatable.

As an example, a cavity of a display device can include at least one sloped surface. Such a surface may provide for movement of one or more cables responsive to force being applied to the one or more cables. For example, a sloped surface can act as a funnel that helps to guide a cable or cables in a desired direction, which may be toward an arm (e.g., a gap region of an arm as shown in the example of FIG. 6A). As an example, consider a funnel that directs cables to an opening that is aligned with a gap of an arm. As to force, such force may be applied via closing of a cover. For example, a cover may contact one or more cables in a cavity such that the cables move in a desired direction along a sloped surface and toward an opening.

As an example, a display device can include one or more processors and memory accessible to at least one of the one or more processors. In such an example, the display device may be an all-in-one (AIO) type of computing device that includes various cable connectors where the display device can be coupled to an arm, which may be coupled to a base where the arm and the base form a stand.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 16:
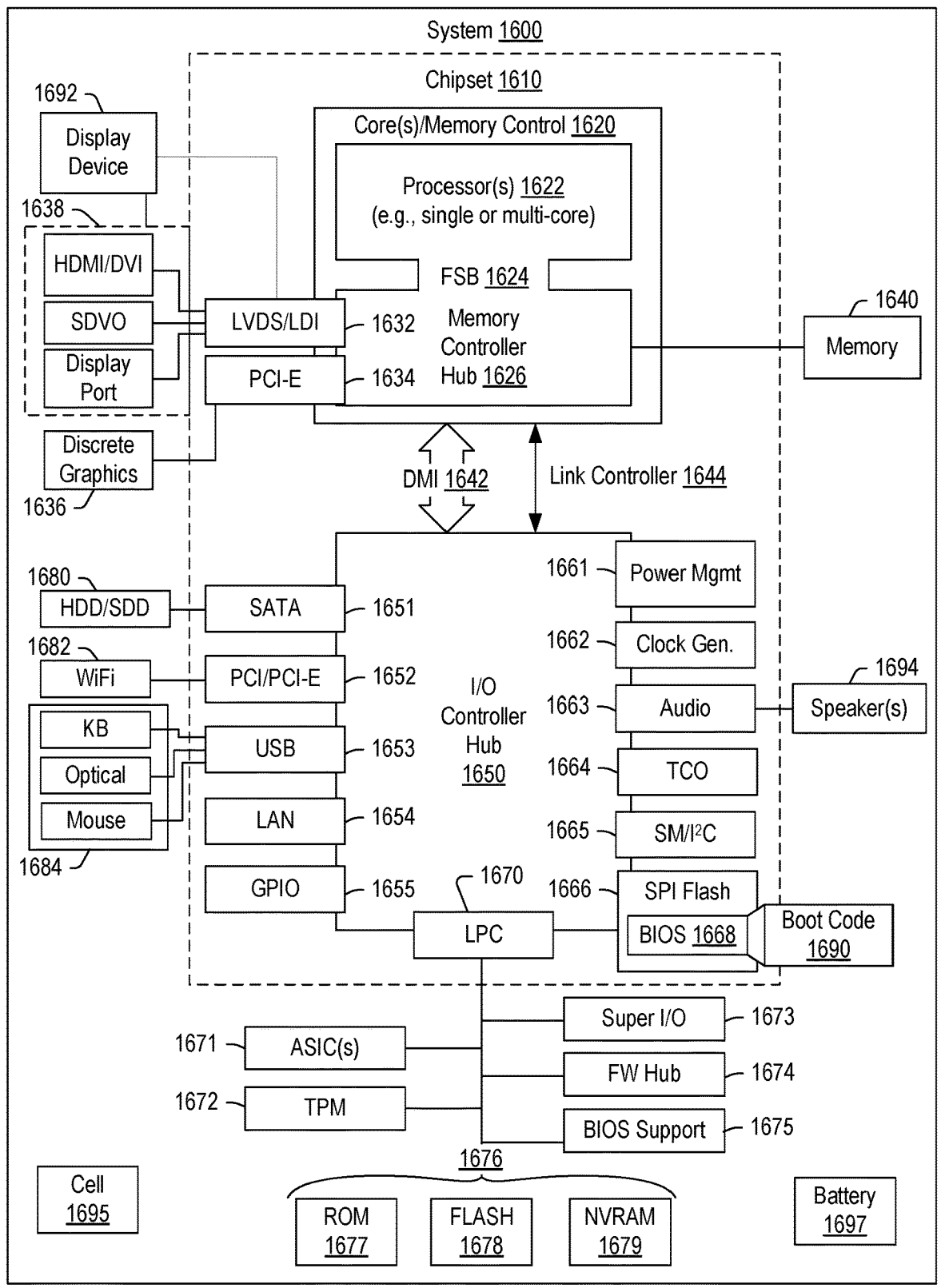
FIG. 16 is a diagram of an example of a system.

While various examples of circuits or circuitry have been discussed, FIG. 16 depicts a block diagram of an illustrative computer system 1600. The system 1600 may be a computer system sold by Lenovo (US) Inc. of Morrisville, N.C. (e.g., a THINKSTATION® system, etc.); however, as apparent from the description herein, a satellite, a base, a display, a computing device, a server or other machine may include one or more features and/or other features of the system 1600.

As an example, a monitor or display may include features such as one or more of the features included in one of the LENOVO® IDEADCENTRE® or THINKCENTRE® "all-in-one" (AIO) computing devices (e.g., sold by Lenovo (US) Inc. of Morrisville, N.C.). For example, the LENOVO® IDEADCENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 16, the system 1600 includes a so-called chipset 1610. A chipset refers to a group of integrated circuits, or chips, that are designed to work together. Chipsets are usually marketed as a single product (e.g., consider chipsets marketed under the brands INTEL®, AMD®, etc.).

In the example of FIG. 16, the chipset 1610 has a particular architecture, which may vary to some extent depending on brand or manufacturer. The architecture of the chipset 1610 includes a core and memory control group 1620 and an I/O controller hub 1650 that exchange information (e.g., data, signals, commands, etc.) via, for example, a direct management interface or direct media interface (DMI) 1642 or a link controller 1644. In the example of FIG. 16, the DMI 1642 is a chip-to-chip interface (sometimes referred to as being a link between a "northbridge" and a "southbridge").

The core and memory control group 1620 include one or more processors 1622 (e.g., single core or multi-core) and a memory controller hub 1626 that exchange information via a front side bus (FSB) 1624. As described herein, various components of the core and memory control group 1620 may be integrated onto a single processor die, for example, to make a chip that supplants the conventional "northbridge" style architecture.

The memory controller hub 1626 interfaces with memory 1640. For example, the memory controller hub 1626 may provide support for DDR SDRAM memory (e.g., DDR, DDR2, DDR3, etc.). In general, the memory 1640 is a type of random-access memory (RAM). It is often referred to as "system memory".

The memory controller hub 1626 further includes a low-voltage differential signaling interface (LVDS) 1632. The LVDS 1632 may be a so-called LVDS Display Interface (LDI) for support of a display device 1692 (e.g., a CRT, a flat panel, a projector, etc.). A block 1638 includes some examples of technologies that may be supported via the LVDS interface 1632 (e.g., serial digital video, HDMI/DVI, display port). The memory controller hub 1626 also includes one or more PCI-express interfaces (PCI-E) 1634, for example, for support of discrete graphics 1636. Discrete graphics using a PCI-E interface has become an alternative approach to an accelerated graphics port (AGP). For example, the memory controller hub 1626 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1650 includes a variety of interfaces. The example of FIG. 16 includes a SATA interface 1651, one or more PCI-E interfaces 1652 (optionally one or more legacy PCI interfaces), one or more USB interfaces 1653, a LAN interface 1654 (more generally a network interface), a general purpose I/O interface (GPIO) 1655, a low-pin count (LPC) interface 1670, a power management interface 1661, a clock generator interface 1662, an audio interface 1663 (e.g., for speakers 1694), a total cost of operation (TCO) interface 1664, a system management bus interface (e.g., a multi-master serial computer bus interface) 1665, and a serial peripheral flash memory/controller interface (SPI Flash) 1666, which, in the example of FIG. 16, includes BIOS 1668 and boot code 1690. With respect to network connections, the I/O hub controller 1650 may include integrated gigabit Ethernet controller lines multiplexed with a PCI-E interface port. Other network features may operate independent of a PCI-E interface.

The interfaces of the I/O hub controller 1650 provide for communication with various devices, networks, etc. For example, the SATA interface 1651 provides for reading, writing or reading and writing information on one or more drives 1680 such as HDDs, SDDs or a combination thereof. The I/O hub controller 1650 may also include an advanced host controller interface (AHCI) to support one or more drives 1680. The PCI-E interface 1652 allows for wireless connections 1682 to devices, networks, etc. The USB interface 1653 provides for input devices 1684 such as keyboards (KB), one or more optical sensors, mice and various other devices (e.g., microphones, cameras, phones, storage, media players, etc.). On or more other types of sensors may optionally rely on the USB interface 1653 or another interface (e.g., I²C, etc.). As to microphones, the system 1600 of FIG. 16 may include hardware (e.g., audio card) appropriately configured for receipt of sound (e.g., user voice, ambient sound, etc.).

In the example of FIG. 16, the LPC interface 1670 provides for use of one or more ASICs 1671, a trusted platform module (TPM) 1672, a super I/O 1673, a firmware hub 1674, BIOS support 1675 as well as various types of memory 1676 such as ROM 1677, Flash 1678, and non-volatile RAM (NVRAM) 1679. With respect to the TPM 1672, this module may be in the form of a chip that can be used to authenticate software and hardware devices. For example, a TPM may be capable of performing platform authentication and may be used to verify that a system seeking access is the expected system.

The system 1600, upon power on, may be configured to execute boot code 1690 for the BIOS 1668, as stored within the SPI Flash 1666, and thereafter processes data under the control of one or more operating systems and application software (e.g., stored in system memory 1640). An operating system may be stored in any of a variety of locations and accessed, for example, according to instructions of the BIOS 1668. Again, as described herein, a satellite, a base, a server or other machine may include fewer or more features than shown in the system 1600 of FIG. 16. Further, the system 1600 of FIG. 16 is shown as optionally include cell phone circuitry 1695, which may include GSM, CDMA, etc., types of circuitry configured for coordinated operation with one or more of the other features of the system 1600.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An assembly comprising:
   a stand that comprises a base, an arm that extends from the base to a free end, and a shell operatively coupled to the arm, wherein the arm comprises a front, a back, and a side channel disposed between the front and the back, wherein the side channel comprises a curved portion and a straight portion, and wherein the shell comprises a top, a bottom, a front opening, and a bottom end opening, wherein an open orientation of the shell exposes a portion of the back and the side channel of the arm, wherein a closed orientation of the shell covers the side channel of the arm wherein the side channel is accessible via the front opening of the shell and is accessible via the bottom end opening of the shell, and wherein the arm and the shell comprise axles received in tracks for transition of the shell between the open orientation and the closed orientation; and
   a display device that comprises cable connectors and an arm mount to couple the display device to the free end of the arm.

2. The assembly of claim 1 wherein the curved portion of the side channel is defined by a radius of curvature that is greater than a bend radius of a cable that comprises a cable connector that matches one of the cable connectors of the display device.

3. The assembly of claim 2 wherein the cable is a video cable with a video cable connector and wherein the one of the cable connectors of the display device is a video cable connector.

4. The assembly of claim 2 wherein the cable is a power cable with a power cable connector and wherein the one of the cable connectors of the display device is a power cable connector.

5. The assembly of claim 1 wherein the side channel is a first side channel of a first side of the arm and further comprising a second side channel of a second, opposing side of the arm.

6. The assembly of claim 1 wherein each of the tracks comprises a horizontal portion and a slanted portion.

7. The assembly of claim 6 wherein, in the open orientation, the shell is supported by the axles being received in the horizontal portions of corresponding tracks.

8. The assembly of claim 1 wherein the shell comprises a U-shaped shell.

9. The assembly of claim 1 wherein the bottom end opening of the shell comprises a U-shaped bottom end opening.

10. The assembly of claim 1 wherein the display device comprises a cover that comprises an open orientation and a closed orientation with respect to the cable connectors.

11. The assembly of claim 10 wherein the display device comprises a cavity defined in part by a connector side surface and wherein the cable connectors are disposed along the connector side surface.

12. The assembly of claim 11 wherein the cover is a translatable cover that translates between the open orientation and the closed orientation.

13. The assembly of claim 11 wherein the cover is a rotatable cover that rotates between the open orientation and the closed orientation.

14. The assembly of claim 11 wherein the cavity comprises at least one sloped surface.

15. The assembly of claim 1 wherein the display device comprises one or more processors and memory accessible to at least one of the one or more processors.

16. An assembly comprising:
a stand that comprises a base, an arm that extends from the base to a free end, and a shell operatively coupled to the arm, wherein the arm comprises a front, a back, and opposing side channels disposed between the front and the back, wherein each of the side channels comprises a curved portion and a straight portion, and wherein the shell comprises a top, a bottom, a front opening, and a bottom end opening, wherein an open orientation of the shell exposes a portion of the back and the opposing side channels of the arm, wherein a closed orientation of the shell covers the opposing side channels of the arm wherein the side channels are accessible via the front opening of the shell and are accessible via the bottom end opening of the shell; and
a display device that comprises cable connectors and an arm mount to couple the display device to the free end of the arm.

17. The assembly of claim 16 wherein the arm comprises a divider that separates the first side channel and the second side channel.

18. The assembly of claim 17 wherein the divider comprises an upper divider end and a lower divider end, wherein, in the closed orientation of the shell, a line of sight exists to the lower divider end through the bottom end opening of the shell.

19. A method comprising:
for an assembly that comprises a stand, a shell, and a display device, wherein the stand comprises a base, an arm that extends from the base to a free end, wherein the arm comprises a front, a back, and a side channel disposed between the front and the back, wherein the side channel comprises a curved portion and a straight portion, wherein the shell is operatively coupled to the arm and comprises a top, a bottom, a front opening, and a bottom end opening, wherein an open orientation of the shell exposes a portion of the back and the side channel of the arm, wherein a closed orientation of the shell covers the side channel of the arm wherein the side channel is accessible via the front opening of the shell and is accessible via the bottom end opening of the shell, wherein the arm and the shell comprise axles received in tracks for transitioning the shell between the open orientation and the closed orientation, and wherein the display device comprises cable connectors and an arm mount to couple the display device to the free end of the arm, transitioning the shell between the closed orientation and the open orientation for receipt of a cable in the side channel; and
transitioning the shell between the open orientation and the closed orientation to cover at least a portion of the cable in the side channel.

20. The method of claim 19, wherein the cable comprises an end connector connected to one of the cable connectors of the display device and an opposing end connector connected to a cable connector that is not one of the cable connectors of the display device, and wherein the cable is received in the side channel without disconnection of the end connectors and the opposing end connector from the respective cable connectors.

* * * * *